(12) United States Patent
Seo

(10) Patent No.: US 10,726,906 B2
(45) Date of Patent: Jul. 28, 2020

(54) MEMORY DEVICE AND OPERATION METHOD THEREOF

(71) Applicant: Samsung Electronics Co., Ltd., Suwon-si (KR)

(72) Inventor: Hyeoungwon Seo, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/432,124

(22) Filed: Jun. 5, 2019

(65) Prior Publication Data
US 2020/0152256 A1 May 14, 2020

(30) Foreign Application Priority Data
Nov. 12, 2018 (KR) .................. 10-2018-0138085

(51) Int. Cl.
| | | |
|---|---|---|
| G11C 11/40 | (2006.01) | |
| G11C 11/408 | (2006.01) | |
| G11C 11/4074 | (2006.01) | |
| G11C 5/14 | (2006.01) | |
| G11C 11/4076 | (2006.01) | |

(52) U.S. Cl.
CPC .......... *G11C 11/4085* (2013.01); *G11C 5/145* (2013.01); *G11C 11/4074* (2013.01); *G11C 11/4076* (2013.01)

(58) Field of Classification Search
CPC .... G11C 11/4085; G11C 5/145; G11C 29/783
See application file for complete search history.

(56) References Cited

U.S. PATENT DOCUMENTS

| | | |
|---|---|---|
| 5,818,790 A | 10/1998 | Kim et al. |
| 6,292,429 B1 | 9/2001 | Furutani et al. |
| 6,343,045 B2 | 1/2002 | Shau |
| 6,493,282 B2 | 12/2002 | Iida et al. |
| 6,549,476 B2 | 4/2003 | Pinney |
| 6,597,622 B2 | 7/2003 | Lee et al. |
| 6,606,275 B2 | 8/2003 | Shau |
| 6,687,148 B2 | 2/2004 | Shau |
| 6,721,222 B2 | 4/2004 | Somasejhar et al. |
| 6,751,111 B2 | 6/2004 | Foss et al. |
| 6,856,447 B2 | 2/2005 | Richards et al. |

(Continued)

FOREIGN PATENT DOCUMENTS

| | | |
|---|---|---|
| JP | H09-312097 A | 12/1997 |
| JP | 2015-162253 A | 9/2015 |

(Continued)

*Primary Examiner* — Han Yang
(74) *Attorney, Agent, or Firm* — Muir Patent Law, PLLC

(57) ABSTRACT

An operation method of a memory device includes sequentially receiving an active command and a precharge command from an external device, during a first time interval, applying a first activation voltage to a selected wordline in response to the active command, applying a second activation voltage to the selected wordline after the first time interval elapses from a first time point when the first active command is received, and applying a first deactivation voltage to the selected wordline in response to the precharge command. The second activation voltage is lower than the first activation voltage and is higher than the first deactivation voltage.

20 Claims, 23 Drawing Sheets

(56) References Cited

U.S. PATENT DOCUMENTS

| | | | |
|---|---|---|---|
| 6,914,841 B1 * | 7/2005 | Thwaite | G11C 11/406 365/203 |
| 6,952,366 B2 | 10/2005 | Forbes | |
| 6,958,945 B2 | 10/2005 | Shore | |
| 6,996,007 B2 | 2/2006 | Ahn et al. | |
| 7,082,048 B2 | 7/2006 | Choi | |
| 7,092,307 B2 | 8/2006 | Chen et al. | |
| 7,099,181 B2 | 8/2006 | Ahn et al. | |
| 7,177,214 B2 | 2/2007 | Lee | |
| 7,184,358 B2 | 2/2007 | Kobayashi et al. | |
| 7,220,634 B2 | 5/2007 | Prall et al. | |
| 7,277,315 B2 | 10/2007 | Yuan et al. | |
| 7,488,082 B2 | 2/2009 | Kim et al. | |
| 7,522,464 B2 | 4/2009 | Yoo et al. | |
| 7,564,736 B2 | 7/2009 | Kobayashi | |
| 7,675,775 B2 | 3/2010 | Scade et al. | |
| 7,808,858 B2 | 10/2010 | Lee et al. | |
| 8,031,512 B2 | 10/2011 | Kye et al. | |
| 8,059,451 B2 | 11/2011 | Song et al. | |
| 8,068,381 B2 | 11/2011 | Chung et al. | |
| 8,156,403 B2 | 4/2012 | Shalvi et al. | |
| 8,203,885 B2 | 6/2012 | Abiko et al. | |
| 8,320,179 B2 | 11/2012 | Norman | |
| 8,374,037 B2 | 2/2013 | Banerjee et al. | |
| 9,183,940 B2 | 11/2015 | Lee | |
| 9,230,677 B2 | 1/2016 | Lee | |
| 9,263,137 B2 | 2/2016 | Lee | |
| 9,437,306 B2 | 9/2016 | Lee | |
| 9,443,578 B2 | 9/2016 | Lee | |
| 9,613,704 B2 | 4/2017 | Lee | |
| 9,805,783 B2 | 10/2017 | Ito et al. | |
| 10,002,657 B2 | 6/2018 | Oh et al. | |
| 10,036,162 B2 | 7/2018 | Geiger | |
| 2003/0235076 A1 | 12/2003 | Forbes | |
| 2005/0036363 A1 | 2/2005 | Shau | |
| 2005/0117429 A1 | 6/2005 | Lin | |
| 2016/0232961 A1 * | 8/2016 | Shin | G11C 11/4087 |
| 2017/0092371 A1 | 3/2017 | Harari | |

FOREIGN PATENT DOCUMENTS

| | | |
|---|---|---|
| KR | 10-0167690 B1 | 2/1999 |
| KR | 10-2003-0000479 A | 1/2003 |
| KR | 10-2010-0064896 A | 6/2010 |

* cited by examiner

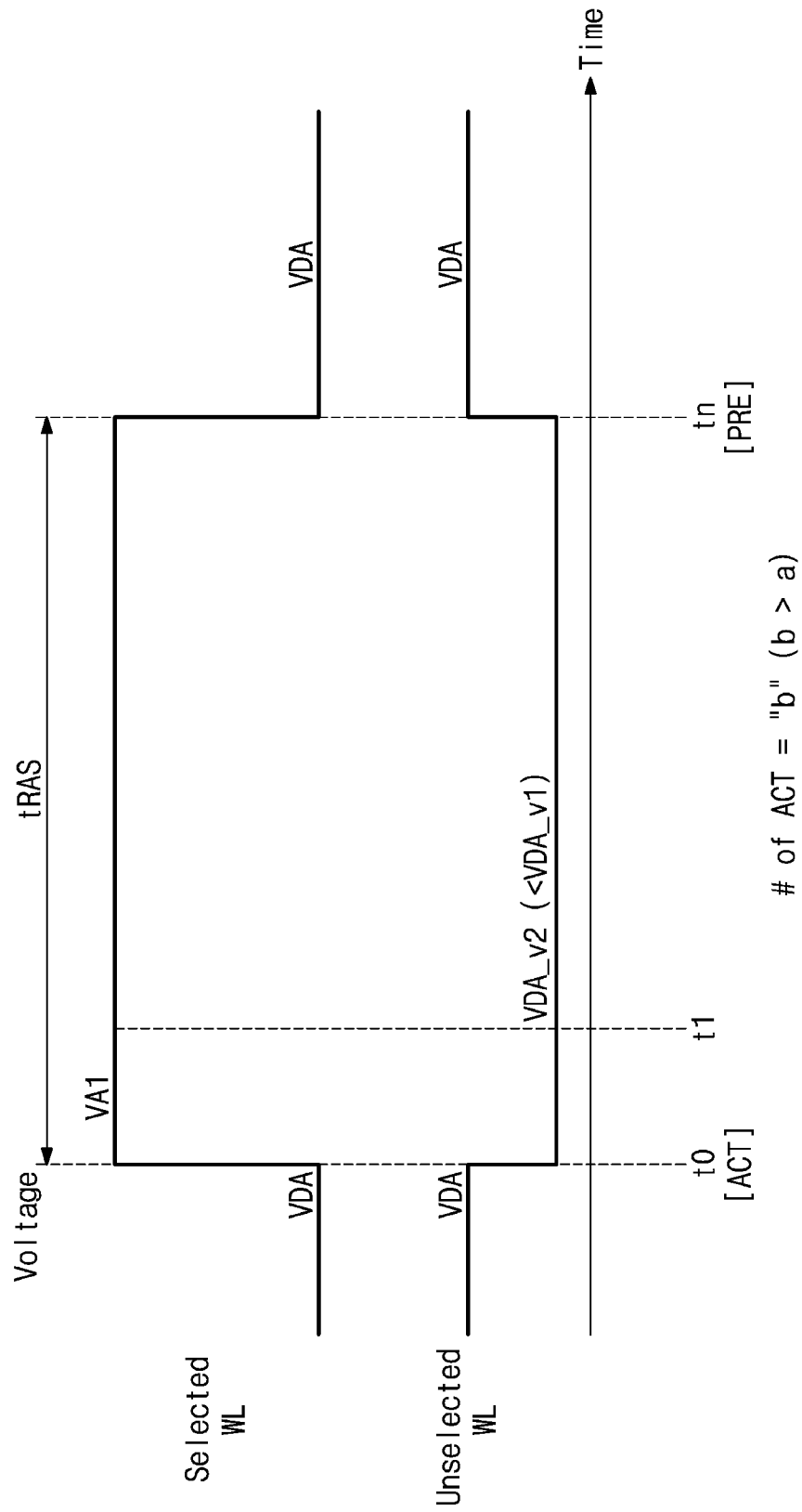

MEMORY DEVICE AND OPERATION METHOD THEREOF

CROSS-REFERENCE TO RELATED APPLICATIONS

This application claims priority under 35 U.S.C. § 119 to Korean Patent Application No. 10-2018-0138085 filed on Nov. 12, 2018, in the Korean Intellectual Property Office, the disclosure of which is incorporated by reference herein in its entirety.

BACKGROUND

Embodiments of the inventive concept described herein relate to a semiconductor memory, and more particularly, relate to a memory device and an operation method thereof.

Semiconductor memory devices may be classified as volatile memory devices, in which stored data disappear when a power is turned off, such as a static random access memory (SRAM) or a dynamic random access memory (DRAM), or nonvolatile memory devices, in which stored data are retained even when a power is turned off, such as a flash memory device, a phase-change RAM (PRAM), a magnetic RAM (MRAM), a resistive RAM (RRAM), or a ferroelectric RAM (FRAM).

Since a DRAM device has a fast operating speed, the DRAM device is used widely as a buffer memory, a system memory, or a working memory of a computing system. Under control of the controller, a general DRAM device activates a wordline and performs a read/write operation on memory cells connected to the activated wordline. In this case, various disturbances may occur within a memory device due to a high voltage provided to a wordline, thereby making the reliability of the memory device low.

SUMMARY

Embodiments of the inventive concept provide a memory device with improved reliability and an operation method thereof.

According to an example embodiment, an operation method of a memory device includes receiving an active command from an external device, during a first time interval, applying a first activation voltage to a selected wordline in response to the active command, applying a second activation voltage to the selected wordline after the first time interval elapses from a first time point when the active command is received, receiving a precharge command from the external device, and applying a first deactivation voltage to the selected wordline in response to the precharge command. The second activation voltage is lower than the first activation voltage and is higher than the first deactivation voltage.

According to an example embodiment, a memory device includes a memory cell array including a plurality of memory cells connected to a plurality of wordlines, a control logic circuit that receives an active command from an external device, and a wordline voltage control circuit. Under control of the control logic circuit receiving the active command, the wordline voltage control circuit applies a first activation voltage to a selected wordline of the plurality of wordlines, and applies a second activation voltage lower than the first activation voltage to the selected wordline after a first time interval elapses from a time point when the active command is received.

According to an example embodiment, an operation method of a memory device includes receiving an active command from an external device, during a first time interval, applying a first activation voltage to a selected wordline and a first deactivation voltage to unselected wordlines in response to the active command, applying a second activation voltage lower than the first activation voltage to the selected wordline and a second deactivation voltage lower than the first deactivation voltage to at least a first wordline of the unselected wordlines after the first time interval elapses from a first time point when the active command is received, receiving a precharge command from the external device, and applying the first deactivation voltage to the selected wordline and the unselected wordlines in response to the precharge command.

BRIEF DESCRIPTION OF THE FIGURES

The above and other objects and features of the inventive concept will become apparent by describing in detail example embodiments thereof with reference to the accompanying drawings.

FIGS. 12A and 12B are graphs for describing an operation of a memory device according to a flowchart of FIG. 11, according to example embodiments.

DETAILED DESCRIPTION

Below, example embodiments of the inventive concept may be described in detail and clearly to such an extent that an ordinary one in the art easily implements the inventive concept.

Figure 1:
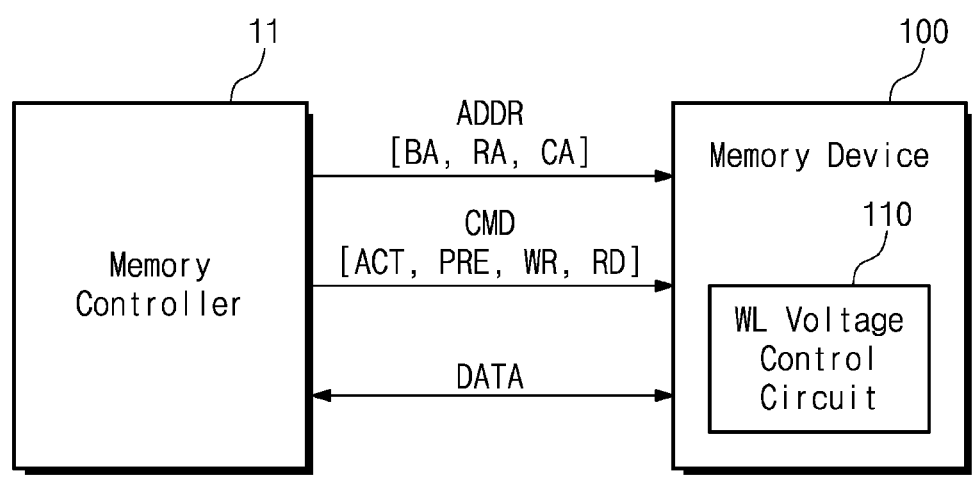
FIG. 1 is a block diagram illustrating a memory system according to example embodiments of the inventive concept.

FIG. 1 is a block diagram illustrating a memory system according to example embodiments of the inventive concept. Referring to FIG. 1, a memory system 10 may include a memory controller 11 and a memory device 100. The memory controller 11 may transmit an address ADDR and a command CMD to the memory device 100 for the purpose of storing data "DATA" in the memory device 100 or reading data "DATA" stored in the memory device 100.

In an example embodiment, the address ADDR may include a row address RA, a column address CA, a bank address BA, etc., and the command CMD may include an active command ACT, a write command WR, a read command RD, or a precharge command PRE. However, the inventive concept is not limited thereto, and the address ADDR and the command CMD may include various forms of addresses and commands.

Under control of the memory controller 11, the memory device 100 may store data "DATA" provided from the memory controller 11 or may provide the stored data "DATA" to the memory controller 11.

Below, to describe the inventive concept easily, it is assumed that the memory device 100 is a dynamic random access memory (DRAM) and the memory controller 11 and the memory device 100 communicate with each other based on a double data rate (DDR) interface. However, the inventive concept is not limited thereto. The memory device 100 may be any one of various memory devices such as a static random access memory (SRAM), a synchronous DRAM (SDRAM), a magnetic random access memory (MRAM), a ferroelectric random access memory (FRAM), a resistive random access memory (ReRAlVI), and a Phase Change Random Access Memory (PRAM), and the memory controller 11 and the memory device 100 may communicate with each other based on any one of various interfaces such as a low power DDR (LPDDR) interface, a universal serial bus (USB) interface, a multimedia card (MMC) interface, a peripheral component interconnect (PCI) interface, a PCI-express (PCI-E) interface, an advanced technology attachment (ATA) interface, a serial ATA (SATA) interface, a parallel ATA (PATA) interface, a small computer system interface (SCSI), an enhanced small disk interface (ESDI), and an integrated drive electronics (IDE) interface.

In an example embodiment, the memory device 100 may include a wordline voltage control circuit 110. The wordline voltage control circuit 110 may be configured to control various voltages to be provided to a plurality of wordlines included in the memory device 100.

A traditional DRAM device applies an activation voltage being a high voltage to a selected wordline of the plurality of wordlines in response to an active command ACT from the memory controller 11 and applies a deactivation voltage to unselected wordlines in response to a precharge command PRE from the memory controller 11. In the case where a time interval (e.g., tRAS) (hereinafter referred to as a "wordline activation period") between the active command ACT and the precharge command PRE increases, memory cells may deteriorate due to the activation voltage being a high voltage.

The memory device 100 according to an embodiment of the inventive concept may apply a first activation voltage to a selected wordline in response to the active command ACT from the memory controller 11 and may apply a second activation voltage lower than the first activation voltage to the selected wordline after a reference time elapses. In this case, even though the time interval (i.e., a tRAS period) between the active command ACT and the precharge command PRE increases, since a level of a voltage applied to the selected wordline decreases, the deterioration of memory cells may be reduced. Below, a method for controlling voltages of wordlines according to an embodiment of the inventive concept will be more fully described with reference to drawings.

Figure 2:
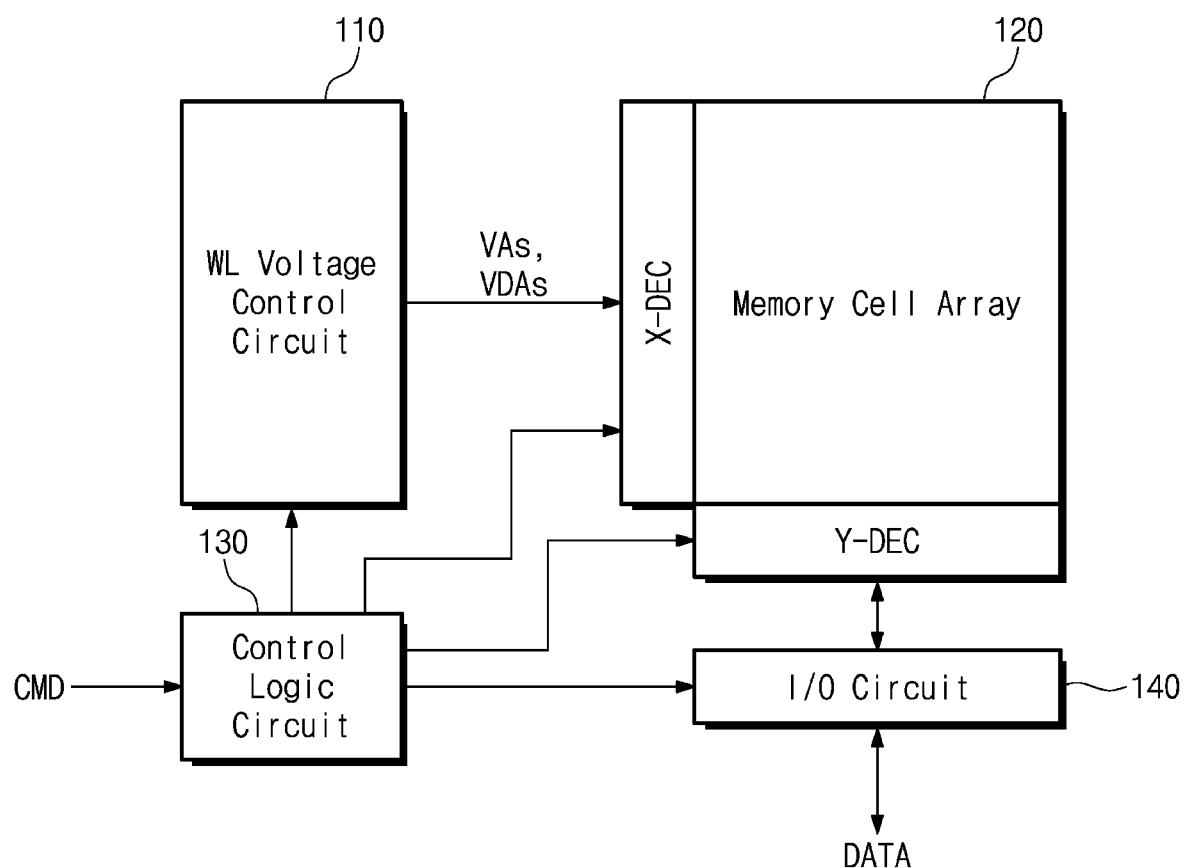
FIG. 2 is a block diagram illustrating a memory device of FIG. 1.

FIG. 2 is a block diagram illustrating a memory device of FIG. 1. Referring to FIGS. 1 and 2, the memory device 100 may include the wordline voltage control circuit 110, a memory cell array 120, a control logic circuit 130, and an input/output circuit 140.

The wordline voltage control circuit 110 may be configured to control a voltage to be provided to a plurality of wordlines of the memory cell array 120, respectively. For example, the wordline voltage control circuit 110 may be configured to generate a plurality of activation voltages VAs and a plurality of deactivation voltages VDAs.

The memory cell array 120 may include a plurality of memory cells. The plurality of memory cells may be connected with a plurality of wordlines and a plurality of bitlines. The wordlines may be connected to an X-decoder X-DEC, and the bitlines may be connected to a Y-decoder Y-DEC.

The control logic circuit 130 may control components of the memory device 100 in response to the command CMD from the memory controller 11. For example, the control logic circuit 130 may control the wordline voltage control circuit 110 in response to the active command ACT from the memory controller 11 such that a first activation voltage VA1 of the plurality of activation voltages VAs is applied to a selected wordline of the plurality of wordlines. In an example embodiment, after a reference time elapses from a time point when the active command ACT is received, the control logic circuit 130 may control the wordline voltage control circuit 110 such that a second activation voltage VA2 lower than the first activation voltage VA1 is applied to the selected wordline. The control logic circuit 130 may control the wordline voltage control circuit 110 in response to the precharge command PRE from the memory controller 11 such that a deactivation voltage VDA is applied to the selected wordline. For example, the deactivation voltage VDA may be a ground voltage VSS or a negative voltage.

In some examples, the first and second activation voltages VA1 and VA2 may be generated by a pumping operation based on a power supply voltage VCC. In this case, a voltage level of each of the first and second activation voltages VA1 and VA2 is higher than the power supply voltage VCC. In some examples, the first activation voltage VA1 may be generated by a pumping operation based on the second activation voltage VA2. In this case, the second activation voltage VA2 is the power supply voltage VCC.

In an example embodiment, the control logic circuit 130 may control the components of the memory device 100 in response to an operation command, such as a read command RD and a write command WR from the memory controller 11, such that an operation (e.g., a read operation or a write operation) corresponding to the operation command is performed.

The input/output circuit 140 may be connected with the Y-decoder Y-DEC, and may temporarily store data to be stored in the memory cell array 120 or data provided from the memory controller 11. The input/output circuit 140 may exchange the data "DATA" with the memory controller 11.

Figure 3:
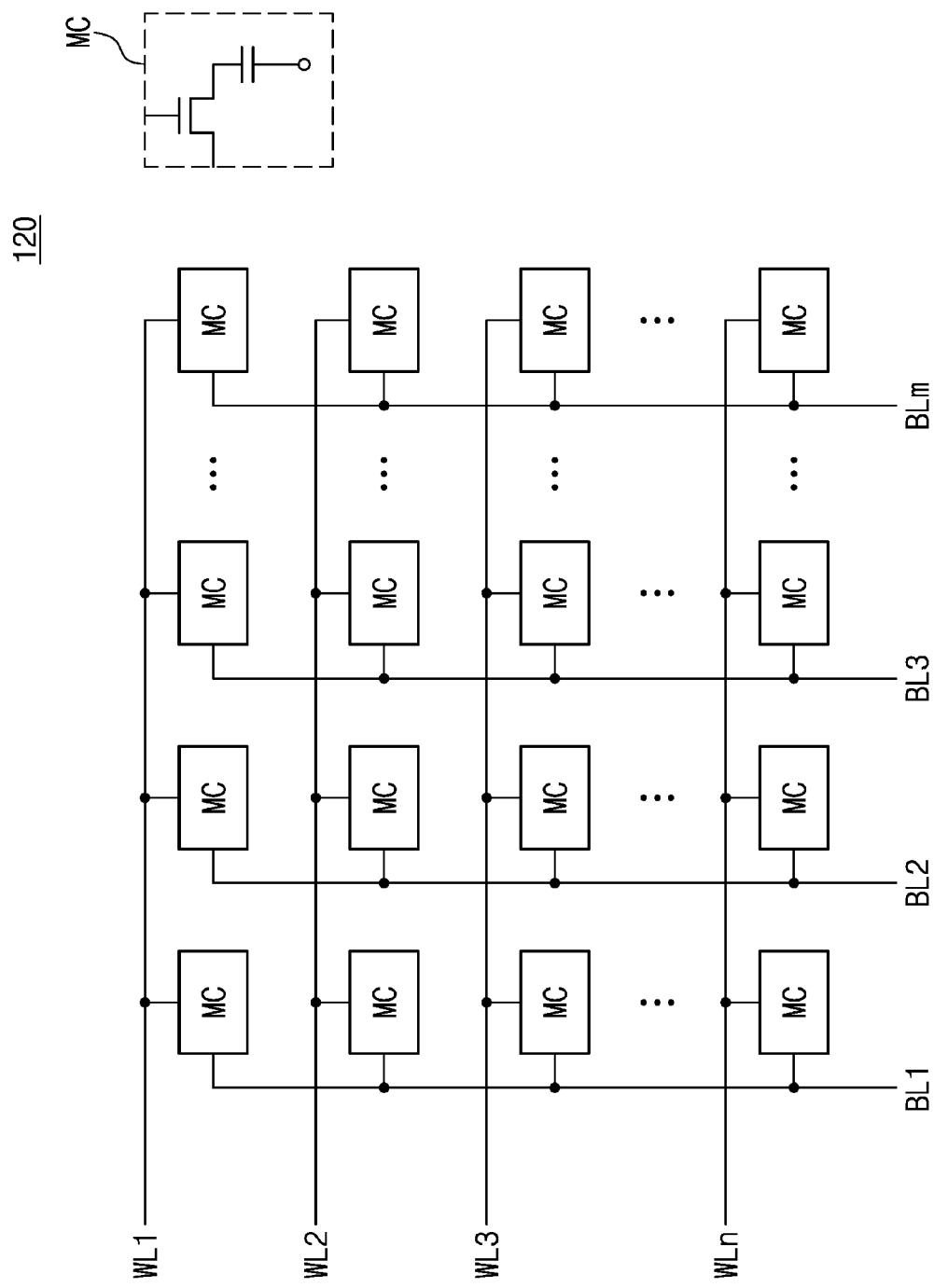
FIG. 3 is a diagram illustrating a memory cell array of FIG. 2.

FIG. 3 is a diagram illustrating a memory cell array of FIG. 2. For convenience of description, some memory cells of the memory cell array 120 are illustrated in FIG. 3, but the inventive concept is not limited thereto. Also, a memory cell MC is illustrated in FIG. 3 as being a DRAM cell, but the inventive concept is not limited thereto.

Referring to FIGS. 2 and 3, the memory cell array 120 may include a plurality of memory cells MC. Each of the memory cells MC may include an access transistor TR and a storage capacitor "C". First ends of the access transistors TR of the memory cells MC are connected to a plurality of bitlines BL1 to BLm, and second ends thereof are connected to first ends of the corresponding storage capacitors "C" of the memory cells MC. Gates of the access transistors TR of the memory cells MC are connected to a plurality of wordlines WL1 to WLn. Second ends of the capacitors "C" may be connected to a voltage terminal. The voltage terminal may be connected to a voltage (e.g., a ground voltage or ½ of a power supply voltage VCC) of a particular level.

In an example embodiment, any one of the plurality of wordlines WL1 to WLn may be selected in response to the active command ACT and the row address RA from the memory controller 11, and the selected wordline may be activated as the first activation voltage VA1 is applied to the selected wordline. As the selected wordline is activated, data stored in memory cells connected with the selected wordline may be provided to the input/output circuit 140 through the plurality of bitlines BL1 to BLm.

Figure 4:
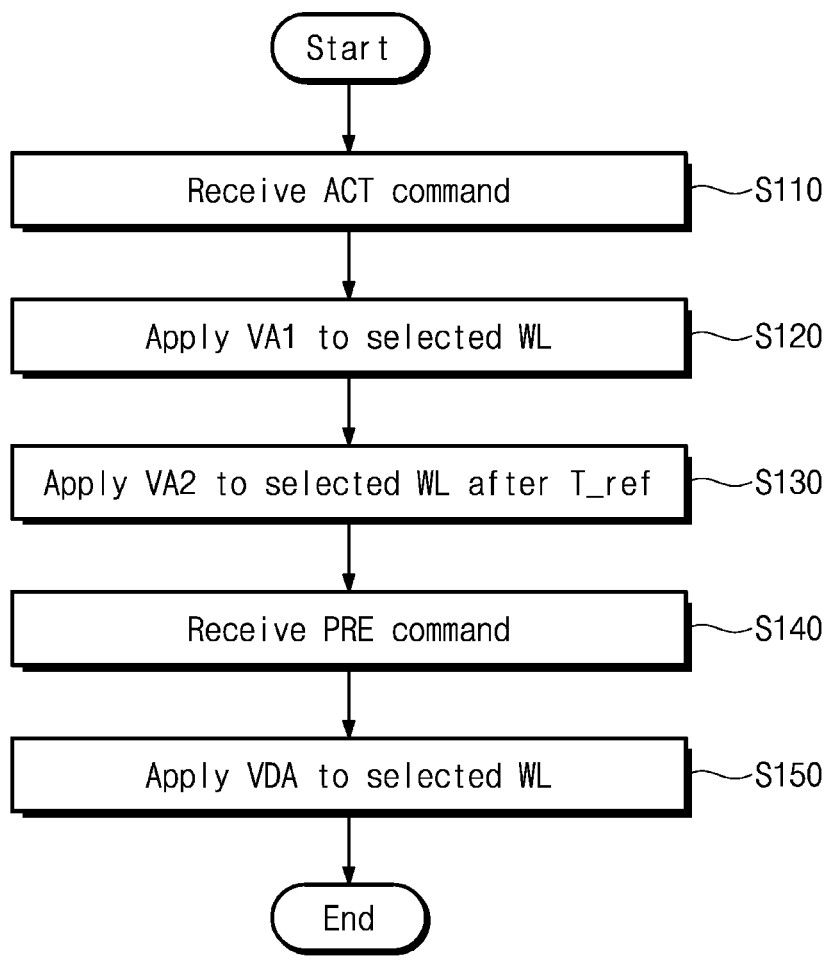
FIG. 4 is a flowchart illustrating an operation of a memory device of FIG. 2 according to example embodiments.

FIG. 4 is a flowchart illustrating an operation of the memory device of FIG. 2 according to example embodiments. Referring to FIGS. 1 to 4, in operation S110, the memory device 100 may receive the active command ACT from the memory controller 11. In an example embodiment, the memory device 100 may receive a row address RA from the memory controller 11 together with the active command ACT.

In operation S120, the memory device 100 may apply the first activation voltage VA1 to a selected wordline. For example, the memory device 100 may select any one of the plurality of wordlines WL1 to WLn based on the row address RA received together with the active command ACT. The memory device 100 may apply the first activation voltage VA1 to the selected wordline such that the selected wordline is activated. In an example embodiment, the first activation voltage VA1 may be a high voltage enough to turn on access transistors TR included in each memory cell MC connected to the selected wordline.

In an example embodiment, the memory device 100 may apply the deactivation voltage VDA to unselected wordlines of the plurality of wordlines. The deactivation voltage VDA may be a low voltage (e.g., a ground voltage or a negative voltage) enough to turn off access transistors TR included in each memory cell MC connected to the unselected wordlines.

In operation S130, the memory device 100 may apply the second activation voltage VA2 to the selected wordline after a reference time interval T_ref elapses from a time point when the active command ACT is received. For example, the second activation voltage VA2 may be a voltage lower than the first activation voltage VA1 as much as a given level (or a predetermined level). In some examples, after the reference time interval T_ref elapses from the time point when the active command ACT is received, the memory device 100 may decrease a voltage of the selected wordline from the first activation voltage VA1 to the second activation voltage VA2. In some examples, after the reference time interval T_ref elapses from a time point when the first activation voltage VA1 is applied, the memory device 100 may decrease a voltage of the selected wordline from the first activation voltage VA1 to the second activation voltage VA2.

In an example embodiment, the second activation voltage VA2 may have a level turning on access transistors TR of each memory cell MC connected to the selected wordline, but may be lower in level than the first activation voltage VA1 and higher in level than the deactivation voltage VDA. For example, as the second activation voltage VA2 lower in level than the first activation voltage VA1 is applied to the selected wordline, deterioration of memory cells connected to the selected wordline or any other wordline adjacent to the selected wordline may decrease compared with the case where the first activation voltage VA1 is applied.

In operation S140, the memory device 100 may receive the precharge command PRE from the memory controller 11. In operation S150, the memory device 100 may apply the deactivation voltage VDA to the selected wordline. For example, the memory device 100 may apply the deactivation voltage VDA to the selected wordline in response to the precharge command PRE for the purpose of deactivating the selected wordline. For example, the deactivation voltage VDA may be applied to all of the wordlines in response to the precharge command PRE.

Although not illustrated in drawings, the memory device 100 may receive various operation commands (e.g., the read command RD and the write command WR) from the memory controller 11 in a time interval between the active command ACT and the precharge command PRE. The memory device 100 may perform an operation corresponding to the received operation command.

Although not illustrated in drawings, after a time interval (e.g., a row precharge time tRP) elapses from a time point when the precharge command PRE is received, the memory device 100 may further receive an additional active command ACT from the memory controller 11.

Figure 5:
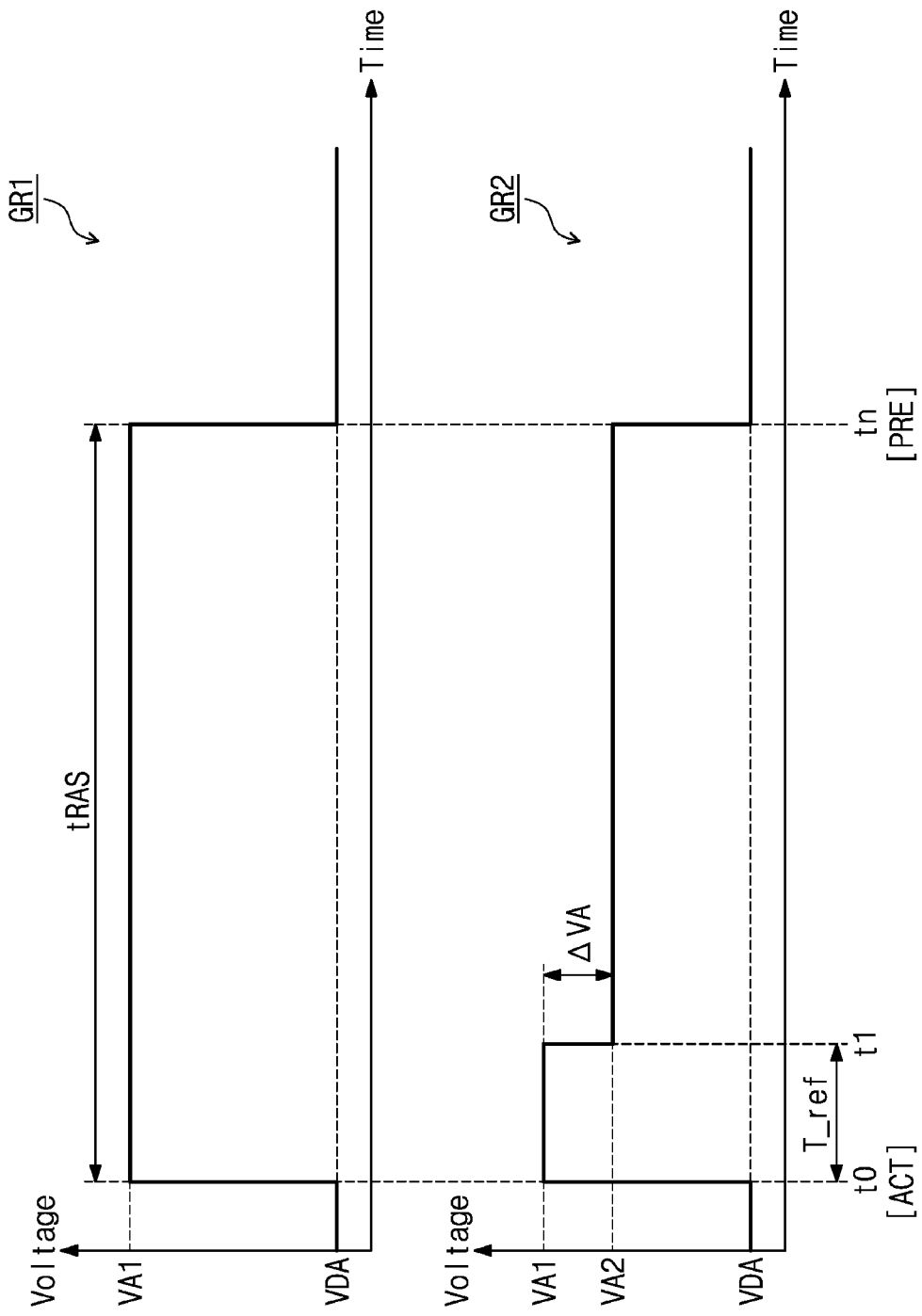
FIG. 5 is a graph for describing an operation of a memory device according to example embodiments of the inventive concept.

FIG. 5 is a graph for describing an operation of a memory device according to example embodiments of the inventive concept. Below, to describe the technical idea of the inventive concept easily, embodiments of the inventive concept will be described with reference to the active command ACT and the precharge command PRE from the memory controller 11. However, the inventive concept is not limited thereto. For example, the memory device 100 may receive various operation commands (e.g., the read command RD, the write command WR, etc.) from the memory controller 11 between the active command ACT and the precharge command PRE and may perform various operations corresponding to the received operation commands.

In the following drawings, a signal waveform is schematically depicted for brevity of illustration. However, the inventive concept is not limited thereto. For example, an actual signal/voltage waveform may be different from a signal/voltage waveform of a graph illustrated in drawings.

Referring to FIGS. 1, 2, and 5, a first graph GR1 shows a voltage which is applied to a selected wordline of a traditional DRAM device. A second graph GR2 shows a voltage which is applied to a selected wordline of the memory device 100 according to the example embodiments of the inventive concept.

As understood from the first graph GR1, the traditional DRAM device receives, at a 0-th time point $t_0$, the active command ACT and the row address RA (not shown) from a memory controller 11, and applies the first activation voltage VA1 to the selected wordline in response to the received active command ACT and the row address RA. The traditional DRAM device maintains a voltage of the selected wordline with the first activation voltage VA1 until the precharge command PRE is received (i.e., an n-th time point tn). Afterwards, the deactivation voltage VDA is applied to the selected wordline in response to the precharge command PRE.

In example embodiments, as understood from the second graph GR2, during the long wordline activation period tRAS, the memory device 100 may apply the first activation voltage VA1 to the selected wordline in response to the active command ACT and the row address RA (not shown) and may apply the second activation voltage VA2 to the selected wordline after the reference time interval T_ref elapses from a 0-th time point t0 when the active command ACT is received, for example, at a first time point t1. In an example embodiment, the second activation voltage VA2 may be a voltage which is lower than the first activation voltage VA1 and is higher than the deactivation voltage VDA.

In some examples, during the reference time interval T_ref, the memory device 100 may restore data in memory cells connected to the selected wordline in response to the active command, and read/write data from/to the memory cells in response to a read/write command received from the memory controller 11.

For example, referring to the first graph GR1, as the wordline activation period tRAS from the 0-th time point t0 when the active command ACT is received to the n-th time point to when the precharge command PRE is received increases, a period of time during which the first activation voltage VA1 is applied to the selected wordline may increase. In this case, since the first activation voltage VA1 being a high voltage is applied to the selected wordline for a long time, deterioration may occur at memory cells connected to the selected wordline or a wordline adjacent to the selected wordline.

In example embodiments, referring to the second graph GR2, the first activation voltage VA1 is applied to the selected wordline only during the reference time interval T_ref, and the second activation voltage VA2 lower than the first activation voltage VA1 is applied to the selected wordline during the remaining wordline activation period (i.e., a time interval from the first time point t1 to the n-th time point tn). For example, even though the wordline activation period tRAS from the 0-th time point t0 when the active command ACT is received to the n-th time point tn when the precharge command PRE is received increases, since the first activation voltage VA1 is applied only during the reference time interval T_ref, deterioration of memory cells may be reduced compared with the traditional DRAM device.

In an example embodiment, a difference OVA between the first activation voltage VA1 and the second activation voltage VA2 may be smaller than a difference between the second activation voltage VA2 and the deactivation voltage VDA. In an example embodiment, the second activation voltage VA2 may be a voltage higher than a threshold voltage of the access transistor TR included in each memory cell MC. For example, as a voltage applied to the selected wordline decreases from the first activation voltage VA1 to the second activation voltage VA2, deterioration of memory cells connected with the selected wordline or wordlines adjacent to the selected wordline may be reduced.

In an example embodiment, the reference time interval T_ref may vary with an operation of the memory device 100. In an example embodiment, the reference time interval T_ref may be a period of time necessary to set up data from memory cells connected to the selected wordline in the input/output circuit 140. For example, during the reference time interval T_ref, the memory device 100 may read data from the memory cells connected to the selected wordline and may set up the read data in the input/output circuit 140. Alternatively, during the reference time interval T_ref, the memory device 100 may read data from the memory cells connected to the selected wordline, may set up the read data in the input/output circuit 140, and may restore the setup data in the memory cells connected to the selected wordline.

Figure 6A:
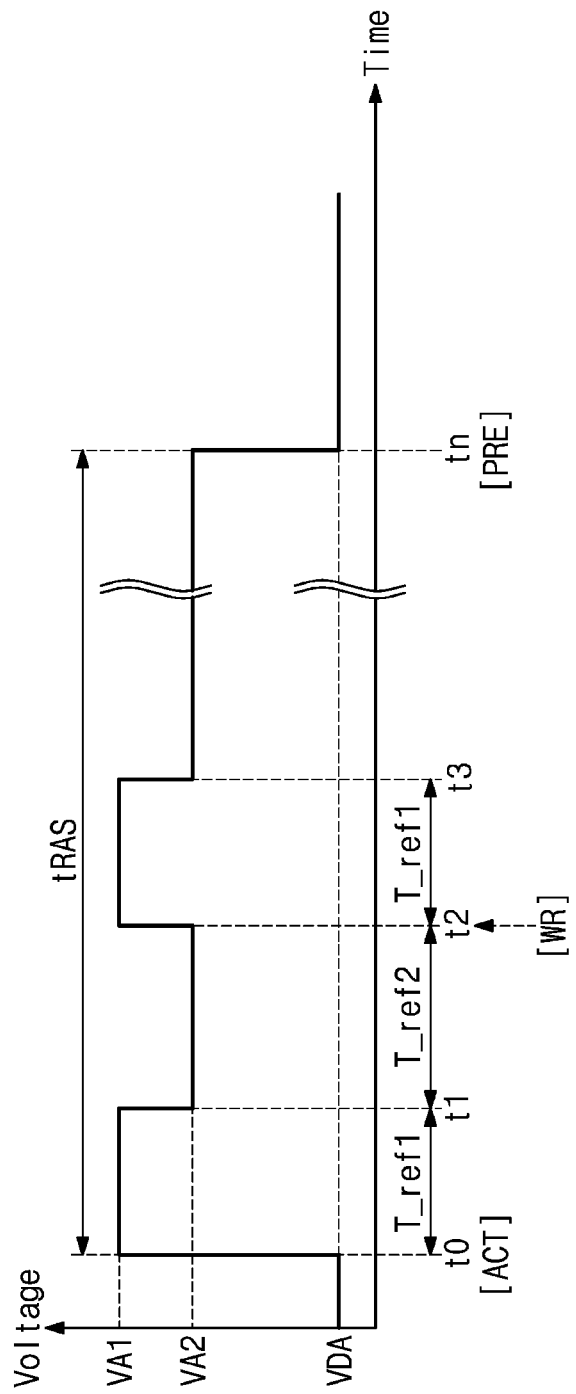
FIGS. 6A to 6C are graphs for describing an operation of a memory device of FIG. 2 according to example embodiments.
Figure 6B:
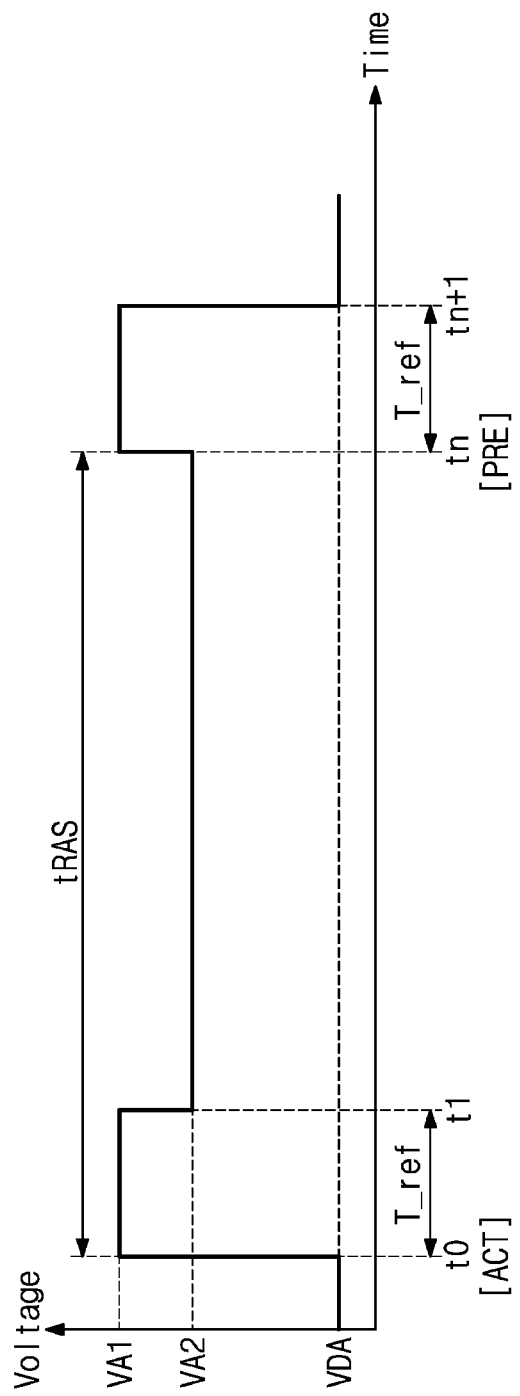
Figure 6C:
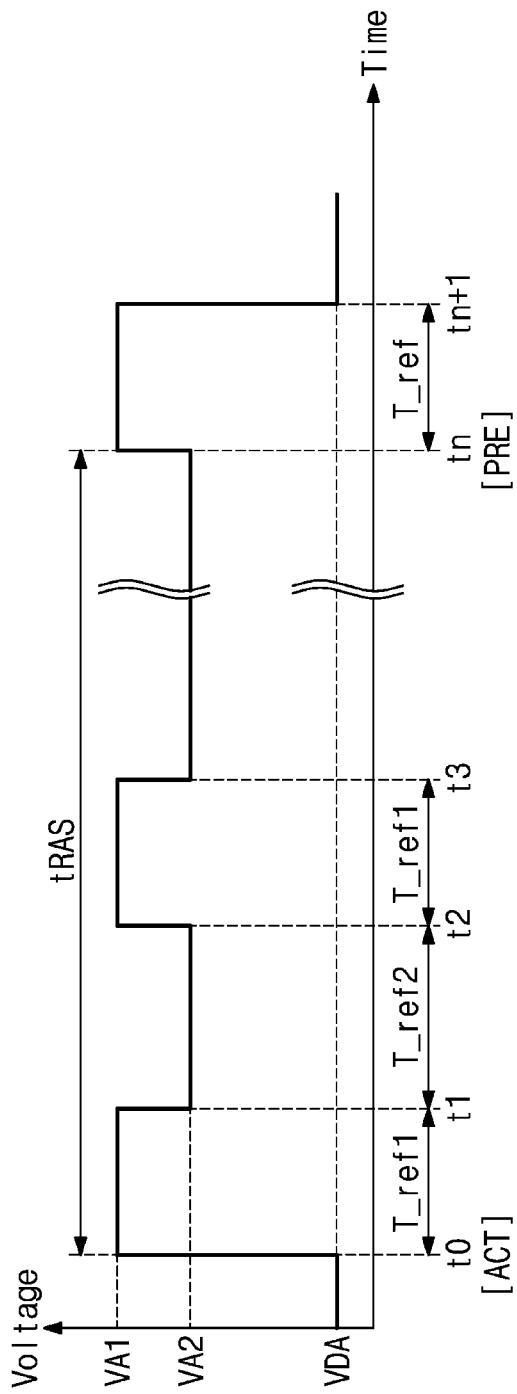

FIGS. 6A to 6C are graphs for describing an operation of a memory device of FIG. 2 according to example embodiments. First, referring to FIGS. 1, 2, and 6A to 6C, the memory device 100, at a 0-th time point t0, may receive the active command ACT from the memory controller 11 and may apply the first activation voltage VA1 to a selected wordline in response to the received active command ACT. At a first time point t1 when a first reference time interval T_ref1 elapses from the 0-th time point t0, the memory device 100 may apply the second activation voltage VA2 to the selected wordline. For example, the memory device 100 may decrease a voltage level applied to the selected wordline after the first reference time interval T_ref1 elapses from the 0-th time point t0.

As illustrated in FIG. 6A, at a second time point t2 when a second reference time interval T_ref2 elapses from the first time point t1, the memory device 100 may again apply the first activation voltage VA1 to the selected wordline. For example, in the case where the second activation voltage VA2 is applied during the second reference time interval T_ref2, a current may be leaked out from memory cells connected to the selected wordline. Due to the leakage current, data stored in the memory cells connected to the selected wordline may be lost. In this case, the memory device 100 may perform a restore operation on the memory cells connected to the selected wordline by applying the first activation voltage VA1 to the selected wordline at the second time point t2.

In an example embodiment, a speed at which memory cells operates while the first activation voltage VA1 is applied to the selected wordline may be higher (or faster) than a speed at which memory cells operates while the second activation voltage VA2 is applied to the selected wordline. The reason is that an access transistor of each memory cell operates quickly when a higher voltage is applied to a corresponding wordline. For example, a particular operation (e.g., a restore operation) may be quickly performed on memory cells by increasing a voltage of the selected wordline from the second activation voltage VA2 to the first activation voltage VA1 within a particular time interval.

In an example embodiment, the second time point t2 to apply the first activation voltage VA1 may be determined by a command from the memory controller 11 instead of the second reference time interval T_ref2. For example, the memory device 100 may receive various operation commands (e.g., the read command RD and the write command WR) from the memory controller 11 during the wordline activation period tRAS between the active command ACT and the precharge command PRE and may perform various operations corresponding to the received operation commands.

For example, in the case where the memory device 100 receives the write command WR from the memory controller 11 at the second time point t2, the memory device 100 may perform an operation corresponding to the write command WR. The write operation comprises writing data in the memory cells connected to the selected wordline. To perform the write operation, the memory device 100 may apply the first activation voltage VA1 to the selected wordline at the second time point t2. Since the first activation voltage VA1 is higher than the second activation voltage VA2, when the first activation voltage VA1 is applied to the selected wordline, a speed of the write operation may be improved. After the write operation is completed, for example, at a third time point t3, the memory device 100 may apply the second activation voltage VA2 to the selected wordline.

For example, in the case where the memory device 100 receives the read command RD from the memory controller 11 at the second time point t2, the memory device 100 may perform an operation corresponding to the read command RD. The read operation comprises reading data from the memory cells connected to the selected wordline. To perform the read operation, the memory device 100 may apply the first activation voltage VA1 to the selected wordline at the second time point t2. Since the first activation voltage VA1 is higher than the second activation voltage VA2, when the first activation voltage VA1 is applied to the selected wordline, a speed of the read operation may be improved. After the read operation is completed, for example, at the third time point t3, the memory device 100 may apply the second activation voltage VA2 to the selected wordline. In an example embodiment, in response to the read command RD, the memory device 100 may output read data without supplying the first activation voltage VA1 to the selected wordline. For example, data stored in the memory cells connected to the selected wordline may be set in the I/O circuit 140 by various operation of the memory device 100 at the first reference time interval T_ref1. Accordingly, even though the first activation voltage VA1 is not supplied to the selected wordlne, data set in the I/O circuit 140 may be output to the memory controller 11.

In an example embodiment, the memory device 100 according to the inventive concept may repeatedly apply the first and second activation voltages VA1 and VA2 to the selected wordline during the wordline activation period tRAS between the active command ACT and the precharge command PRE. A time interval when the first and second activation voltages VA1 and VA2 are applied may be variously changed or modified according to a given reference time and an operation command from the memory controller 11.

As illustrated in FIG. 6B, the memory device 100 may maintain the second activation voltage VA2 of the selected wordline from the first time point t1 to the n-th time point tn (i.e., a time point when the precharge command PRE is received). In response to the precharge command PRE, the memory device 100 may apply the first activation voltage VA1 to the selected wordline from the n-th time point tn to a (n+1)-th time point tn+1, for example, during the reference time interval T_ref. In this case, an amount of the reference time interval T_ref may be variable. Afterwards, the memory device 100 may apply the deactivation voltage VDA to the selected wordline.

For example, in response to the precharge command PRE, the memory device 100 may complete an operation being performed, and may then perform a precharge operation on bitlines. Before precharging the bitlines, the memory device 100 may perform a restore operation for the purpose of preserving data stored in the memory cells connected to the selected wordline. In this case, to improve a speed of the restore operation, the memory device 100 may apply the first activation voltage VA1 to the selected wordline.

As illustrated in FIG. 6C, during the wordline activation period tRAS, the memory device 100 may repeatedly apply the first and second activation voltages VA1 and VA2 to the selected wordline. Afterwards, in response to the precharge command PRE, the memory device 100 may apply the first activation voltage VA1 to the selected wordline. Operations (i.e., an operation of repeatedly applying the first and second activation voltages VA1 and VA2 during the wordline activation period tRAS and an operation of applying the first activation voltage VA1 in response to the precharge command PRE) of the memory device 100 illustrated in FIG. 6C are described with reference to FIGS. 6A and 6B, and thus, additional description will be omitted to avoid redundancy.

As described above, during the wordline activation period tRAS, the memory device 100 may repeatedly apply the first and second activation voltages VA1 and VA2 to the selected wordline. As such, since a time interval while the first activation voltage VA1 being a high voltage is applied during the wordline activation period tRAS decreases, deterioration of memory cells due to the first activation voltage VA1 being a high voltage may be reduced. Accordingly, a memory device with improved reliability and improved performance is provided.

Figure 7:
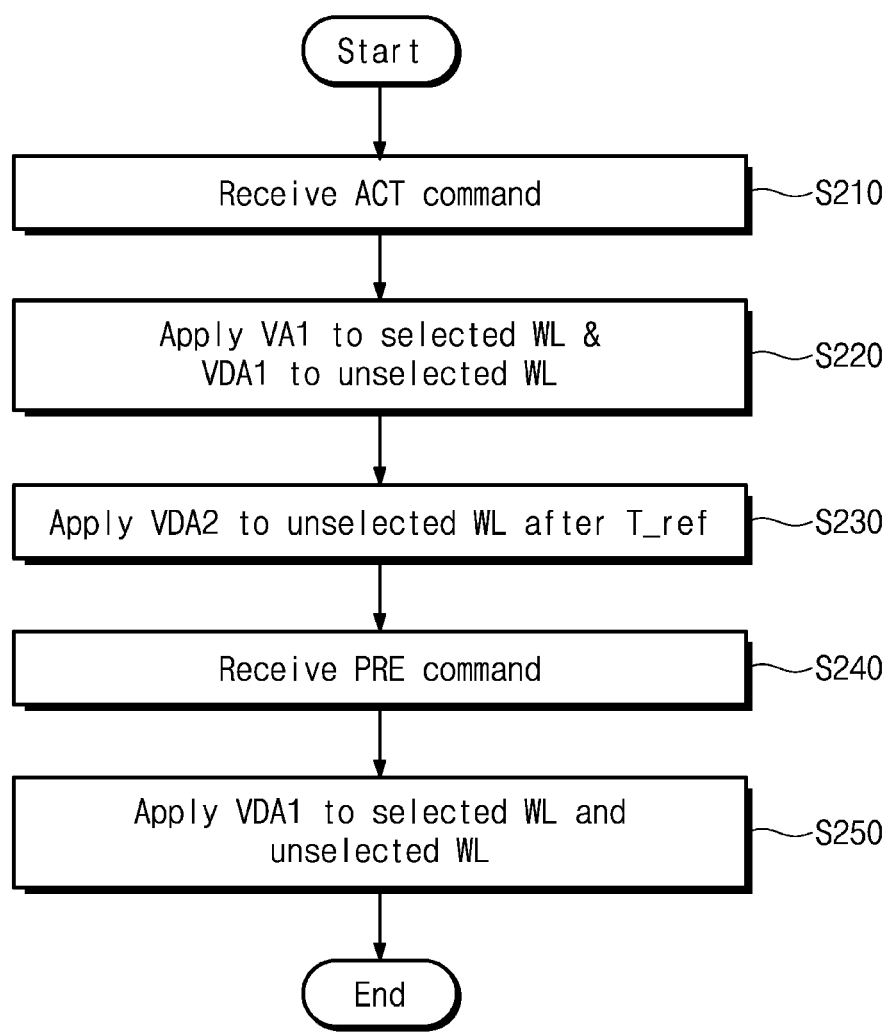
FIG. 7 is a flowchart illustrating an operation of a memory device of FIG. 2 according to example embodiments.
Figure 8:
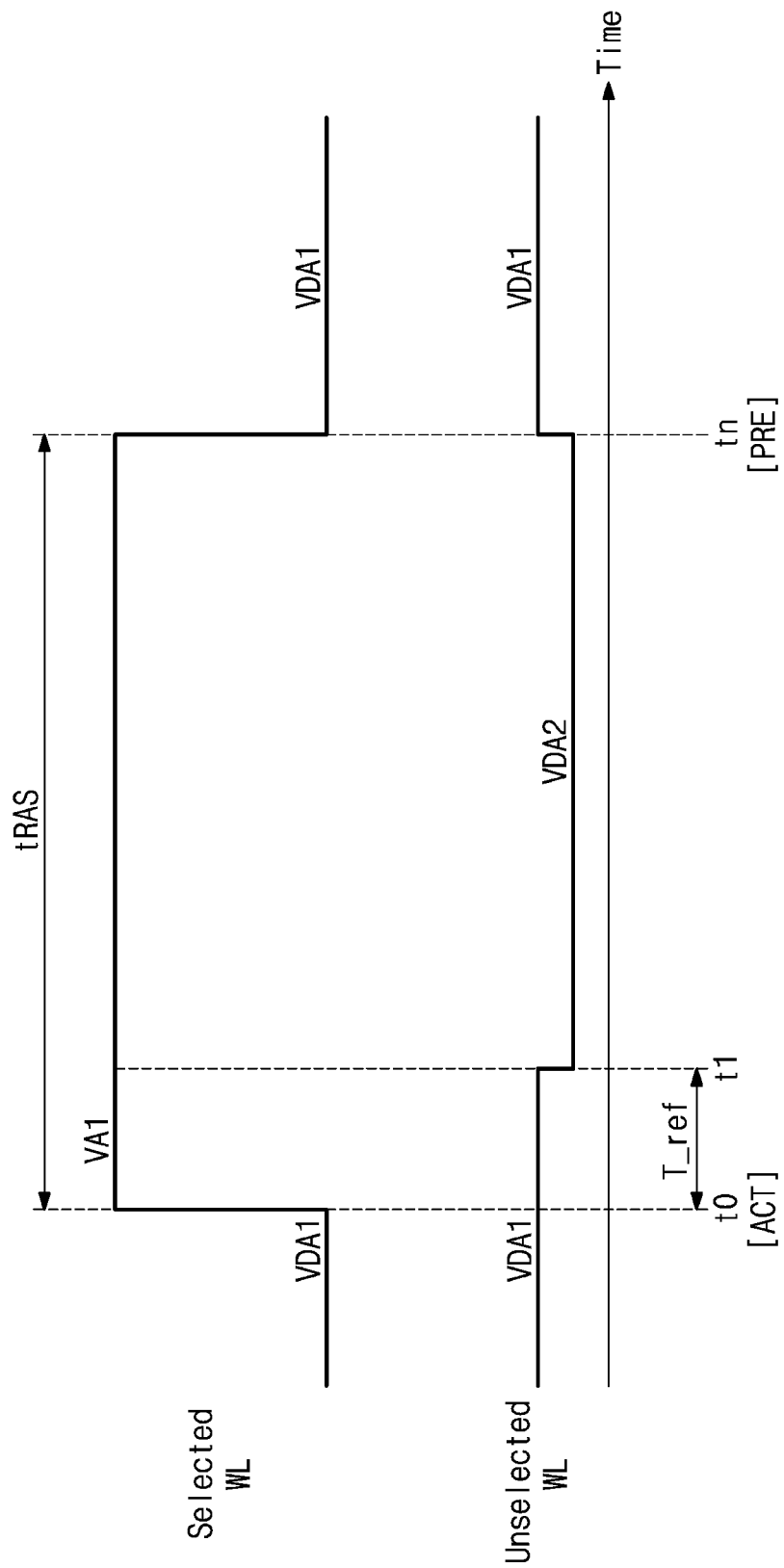
FIG. 8 is a graph for describing an operation according to a flowchart of FIG. 7 according to example embodiments.

FIG. 7 is a flowchart illustrating an operation of a memory device of FIG. 2 according to example embodiments. FIG. 8 is a graph for describing an operation according to a flowchart of FIG. 7, according to example embodiments.

Referring to FIGS. 2, 7, and 8, in operation S210, the memory device 100 may receive the active command ACT from the memory controller 11.

In operation S220, the memory device 100 may apply the first activation voltage VA1 to a selected wordline and may apply a first deactivation voltage VDA1 to unselected wordlines. For example, as described above, the memory device 100 may receive a row address RA from the memory controller 11 together with the active command ACT. The memory device 100 may determine a wordline corresponding to the row address RA among the plurality of wordlines WL1 to WLn as the selected wordline and may determine the remaining wordlines as the unselected wordlines. To activate the selected wordline, the memory device 100 may apply the first activation voltage VA1 to the selected wordline and may apply the first deactivation voltage VDA1 to the unselected wordlines.

In operation S230, the memory device 100 may apply a second deactivation voltage VDA2 to the unselected wordlines after the reference time interval T_ref elapses from a 0-th time point. The first deactivation voltage VDA1 may be a voltage (e.g., a ground voltage or a negative voltage) enough to turn off the access transistor TR included in each memory cell MC. The second deactivation voltage VDA2 may be a voltage lower than the first deactivation voltage VDA1. For example, as the second deactivation voltage VDA2 lower than the first deactivation voltage VDA1 is applied to the unselected wordlines, deterioration which occurs at memory cells connected to unselected wordlines due to a high voltage (i.e., the first activation voltage VA1) of the selected wordline may be reduced.

For example, as illustrated in FIG. 8, at the 0-th time point t0, the memory device 100 may apply the first activation voltage VA1 to the selected wordline and may apply the first deactivation voltage VDA1 to the unselected wordlines. At a first time point t1 when the reference time interval T_ref elapses from the 0-th time point t0, the memory device 100 may apply the second deactivation voltage VDA2 to the unselected wordlines. For example, at the first time point t1, the memory device 100 may decrease a voltage of the unselected wordlines from the first deactivation voltage VDA1 to the second deactivation voltage VDA2. In some examples, at the 0-th time point t0, the memory device 100 may decrease a voltage of the unselected wordlines from the first deactivation voltage VDA1 to the second deactivation voltage VDA2.

In this case, even though the wordline activation period tRAS increases, since voltages of the unselected wordlines are maintained at the second deactivation voltage VDA2 which is relatively low, deterioration of memory cells connected to the unselected wordlines may be reduced.

In operation S240, the memory device 100 may receive the precharge command PRE from the memory controller 11. In operation S250, the memory device 100 may apply the first deactivation voltage VDA1 to the selected wordline and the unselected wordlines.

As described above, during the wordline activation period tRAS, the memory device 100 may decrease a voltage of unselected wordlines from the first deactivation voltage VDA1 to the second deactivation voltage VDA2. As such, deterioration of memory cells connected to the unselected wordlines due to a high voltage (i.e., the first activation voltage VA1) of the selected wordline during the wordline activation period tRAS may be reduced.

Figure 9:
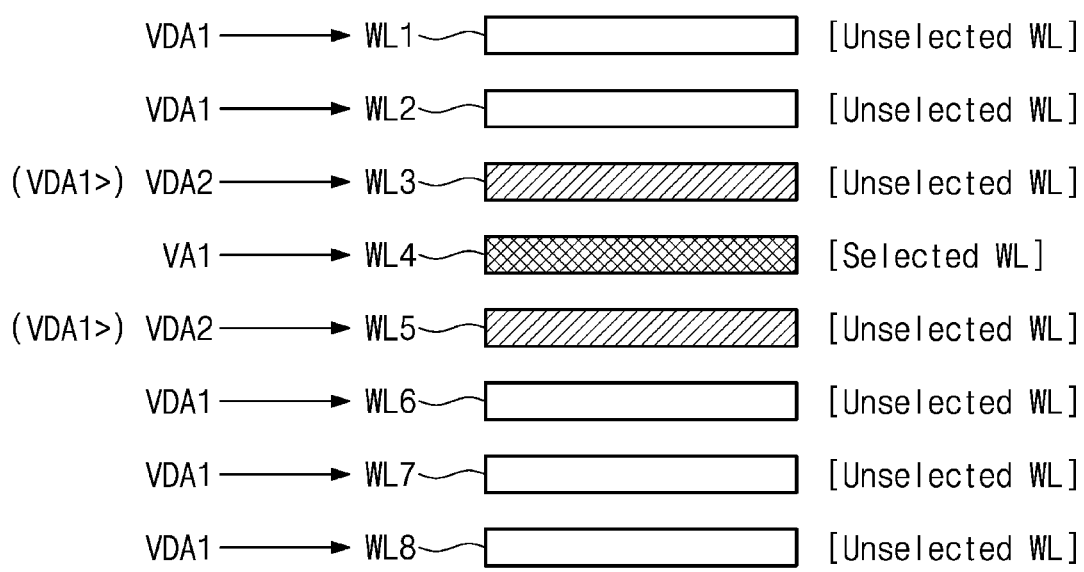
FIG. 9 is a diagram for describing a deactivation voltage applying method of a memory device according to example embodiments of the inventive concept.

FIG. 9 is a diagram for describing a deactivation voltage applying method of a memory device according to example embodiments of the inventive concept. For convenience of description, components unnecessary to describe a deactivation voltage applying method are omitted, and it is assumed that the memory device 100 includes first to eighth wordlines WL1 to WL8. However, the inventive concept is not limited thereto.

Referring to FIGS. 2, 8, and 9, the memory device 100 may apply the first activation voltage VA1 to a selected wordline (e.g., the fourth wordline WL4) in response to the active command ACT. In this case, the remaining wordlines (e.g., the first, second, third, fifth, sixth, seventh, and eighth wordlines WL1, WL2, WL3, WL5, WL6, WL7, and WL8) other than the selected wordline may be unselected wordlines.

The memory device 100 may apply the first deactivation voltage VDA1 or the second deactivation voltage VDA2 to the unselected wordlines. For example, the memory device 100 may apply the second deactivation voltage VDA2 to unselected wordlines (e.g., the third and fifth wordlines WL3 and WL5) adjacent to the selected wordline (e.g., the fourth wordline WL4) and may apply the first deactivation voltage VDA1 to the remaining unselected wordlines (e.g., the first, second, sixth, seventh, and eighth wordlines WL1, WL2, WL6, WL7, and WL8). For example, the memory device 100 may apply a relatively low deactivation voltage (e.g., the second deactivation voltage VDA2) to an unselected wordline(s) adjacent to the selected wordline and may apply a relatively high deactivation voltage (e.g., the first deactivation voltage VDA1) to the remaining unselected wordlines.

Although not illustrated in FIG. 9, an adjacent unselected wordline may indicate one or more unselected wordlines physically adjacent to the selected wordline. In an example embodiment, the memory device 100 may be configured to control a wordline voltage under the condition that a plurality of wordlines are classified into groups.

Figure 10:
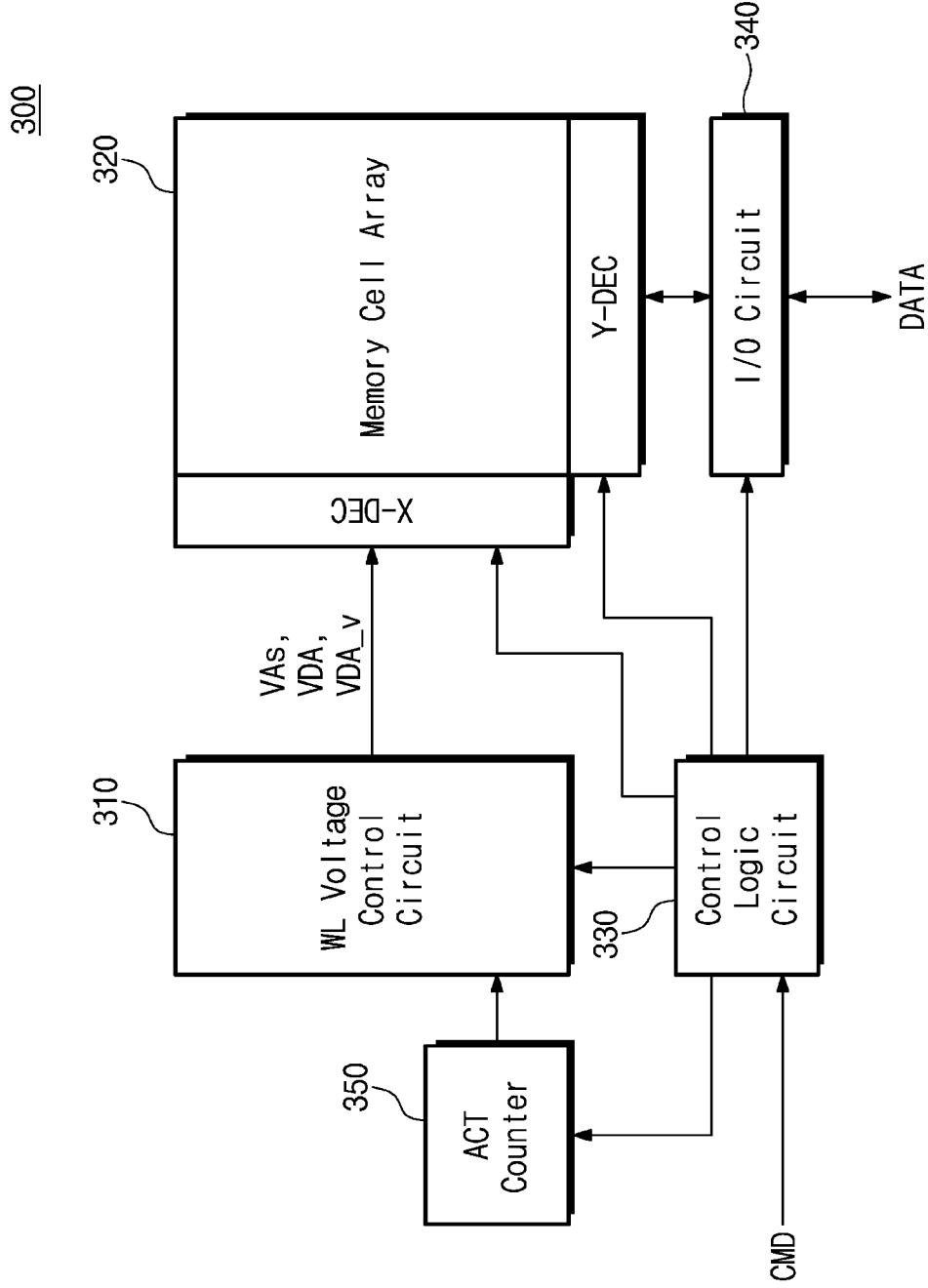
FIG. 10 is a block diagram illustrating a memory device according to an embodiment of the inventive concept.

FIG. 10 is a block diagram illustrating a memory device according to an embodiment of the inventive concept. Referring to FIG. 10, a memory device 300 may include a wordline voltage control circuit 310, a memory cell array 320, a control logic circuit 330, an input/output circuit 340, and an active command counter 350. The wordline voltage control circuit 310, the memory cell array 320, the control logic circuit 330, and the input/output circuit 340 are described above, and thus, additional description will be omitted to avoid redundancy.

The active command counter 350 of the memory device 300 may count the active command ACT from the memory controller 11 (refer to FIG. 1). For example, the active command counter 350 may count a number of active commands ACT received from the memory controller 11 with regard to a particular wordline during a predetermined period. For example, the active command counter 350 may count the number of active commands ACT accumulated with respect to each of a plurality of wordlines.

The wordline voltage control circuit 110 may generate various wordline voltages such as activation voltages VAs, a deactivation voltage VDA, and a variable deactivation voltage VDA_v depending on a counting result of the active command counter 350. For example, the wordline voltage control circuit 310 may adjust the variable deactivation voltage VDA_v based on the counting result of the active command counter 350.

In an example embodiment, as a counting value of the active command counter 350 increases, the variable deactivation voltage VDA_v may decrease. For example, in the case where the active command ACT is frequently repeated with regard to a particular wordline (i.e., in the case where an access to the particular wordline is frequently repeated), a high voltage may be frequently repeatedly applied to the particular wordline, thereby causing deterioration of memory cells connected to one or more adjacent wordlines. In this case, deterioration of memory cells connected to the one or more adjacent wordlines may be reduced by decreasing a deactivation voltage to be applied to the one or more adjacent wordlines (i.e., one or more unselected wordlines).

Figure 11:
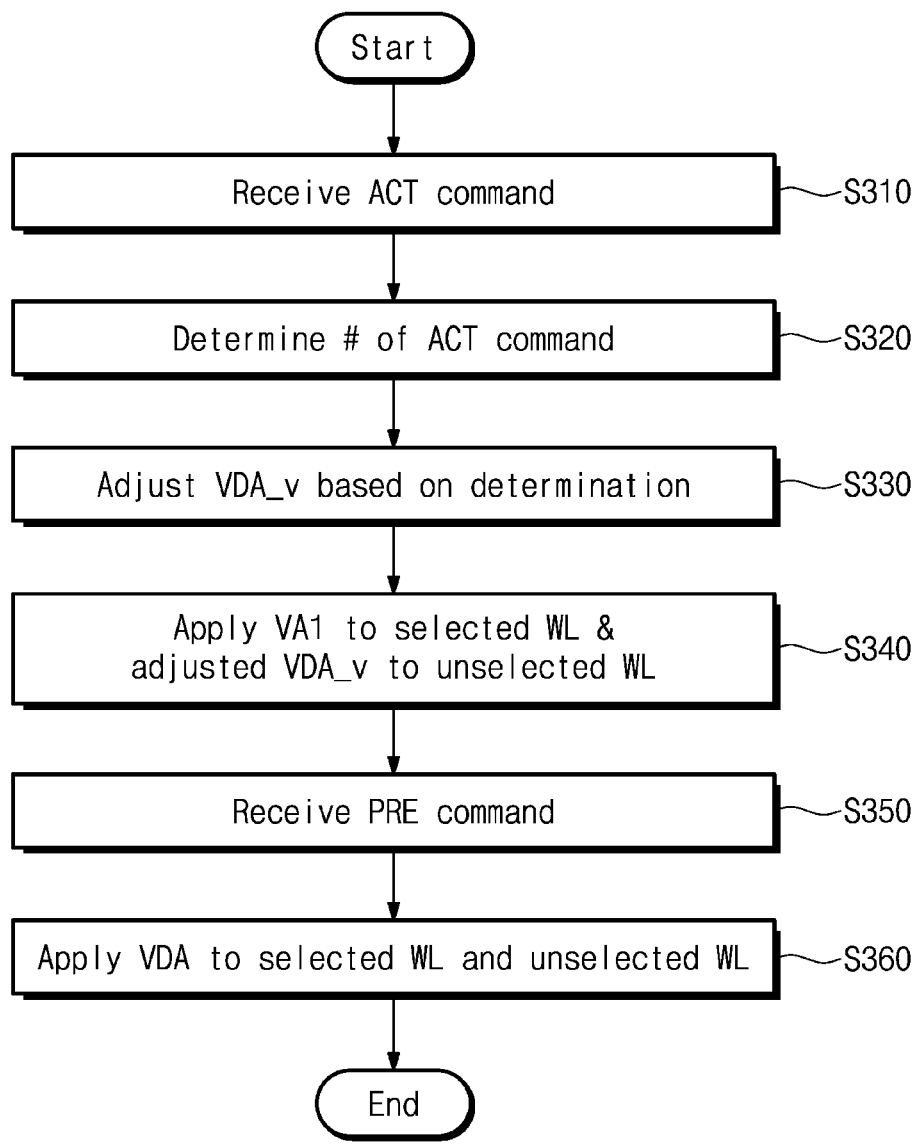
FIG. 11 is a flowchart illustrating an operation of a memory device of FIG. 10 according to example embodiments.
Figure 12A:
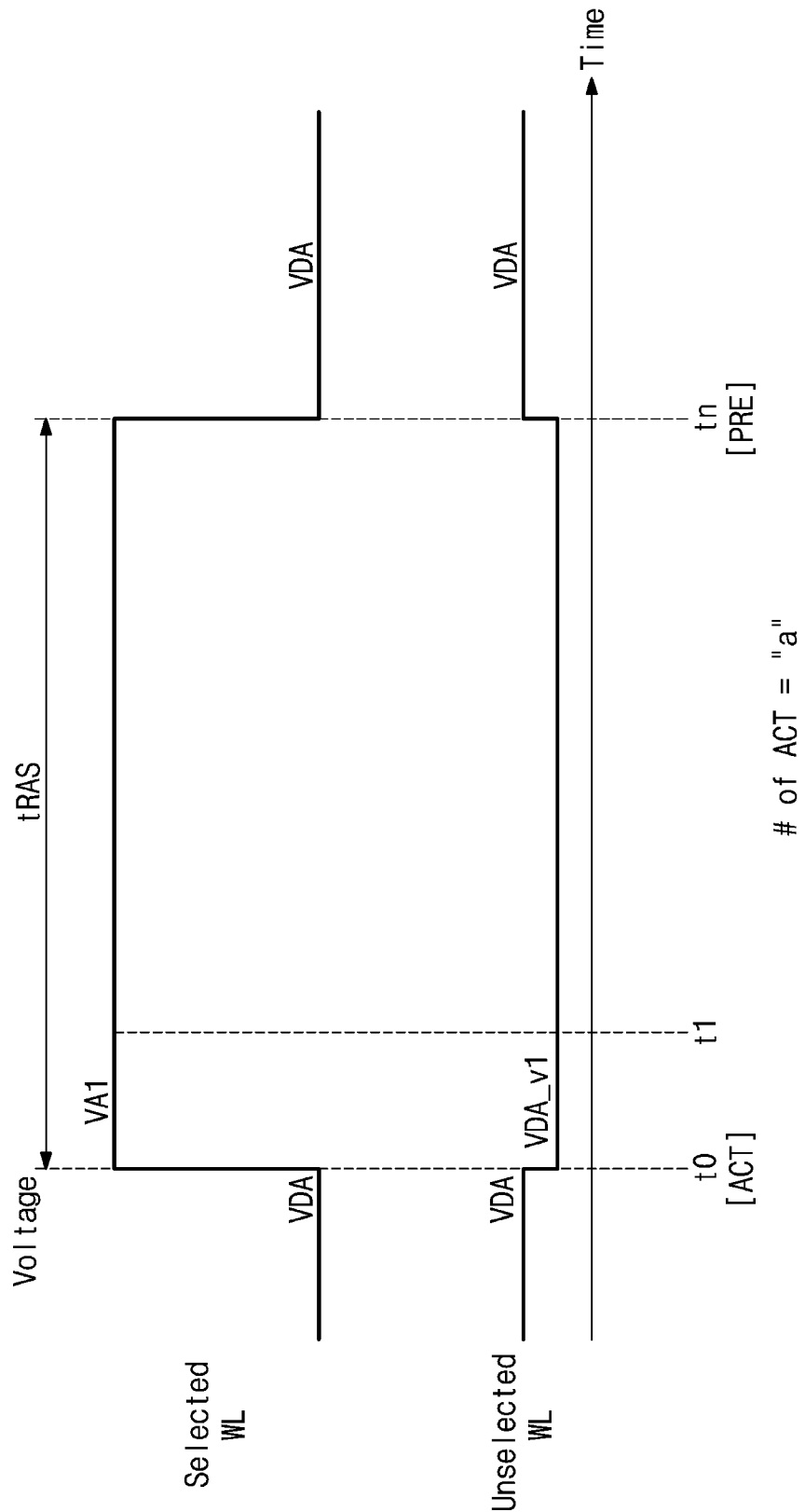

FIG. 11 is a flowchart illustrating an operation of a memory device of FIG. 10 according to example embodiments. FIGS. 12A and 12B are graphs for describing an operation of a memory device according to a flowchart of FIG. 11, according to example embodiments.

Referring to FIGS. 10, 11, 12A and 12B, in operation S310, the memory device 300 may receive the active command ACT.

In operation S320, the memory device 300 may determine a number of active commands ACT during a predetermined period. For example, the active command counter 350 of the memory device 300 may count the number of active commands ACT received from the memory controller 11 (refer to FIG. 1). In an example embodiment, the number of active commands ACT may be managed for each wordline or each wordline group. For example, the active command counter 350 may count the number of active commands ACT with respect to each of a plurality of wordlines.

In operation S330, the memory device 300 may adjust the variable deactivation voltage VDA_v based on a result of the determination. For example, as illustrated in FIG. 12A, in the case where the number (i.e., a counting value) of active commands ACT associated with a selected wordline is "a", the memory device 300 may adjust the variable deactivation voltage VDA_v to a first variable deactivation voltage VDA_v1.

As illustrated in FIG. 12B, in the case where the number (i.e., a counting value) of active commands ACT associated with the selected wordline is "b" (here, a value of "b" is greater than a value of "a"), the memory device 100 may adjust the variable deactivation voltage VDA_v to a second variable deactivation voltage VDA_v2 lower than the first variable deactivation voltage VDA_v1. For example, the memory device 300 may decrease a level of the variable deactivation voltage VDA_v as the number of active commands ACT increases.

In operation S340, the memory device 300 may apply the first activation voltage VA1 to the selected wordline in response to the active command ACT at the 0-th time point t0, and may apply the adjusted variable deactivation voltage VDA_v to unselected wordlines. In some examples, the memory device 300 may apply the first variable deactivation voltage VDA_v1 to the unselected wordlines at the first time point t1 after the reference time interval T_ref elapses from the 0-th time point t0 when the active command ACT is received. In some examples, the memory device 300 may apply the second variable deactivation voltage VDA_v2 to the unselected wordlines at the first time point t1 after the reference time interval T_ref elapses from the 0-th time point t0 when the active command ACT is received.

In operation S350, the memory device 300 may receive the precharge command PRE. In operation S360, the memory device 300 may apply the deactivation voltage VDA to the selected wordline and the unselected wordlines. In an example embodiment, the first and second variable deactivation voltages VDA_v1 and VDA_v2 may be lower than the deactivation voltage VDA.

As described above, the memory device 300 according to an embodiment of the inventive concept may adjust a level of a deactivation voltage to be applied to unselected wordlines depending on the number of active commands ACT. As such, in the case where the active command ACT is frequently repeated with regard to a particular wordline (i.e., in the case where an access to the particular wordline is frequently repeated), deterioration of memory cells connected to the unselected wordlines due to a high voltage repeatedly applied to the particular wordline may be reduced by decreasing a level of a deactivation voltage to be applied to unselected wordlines.

Figure 13:
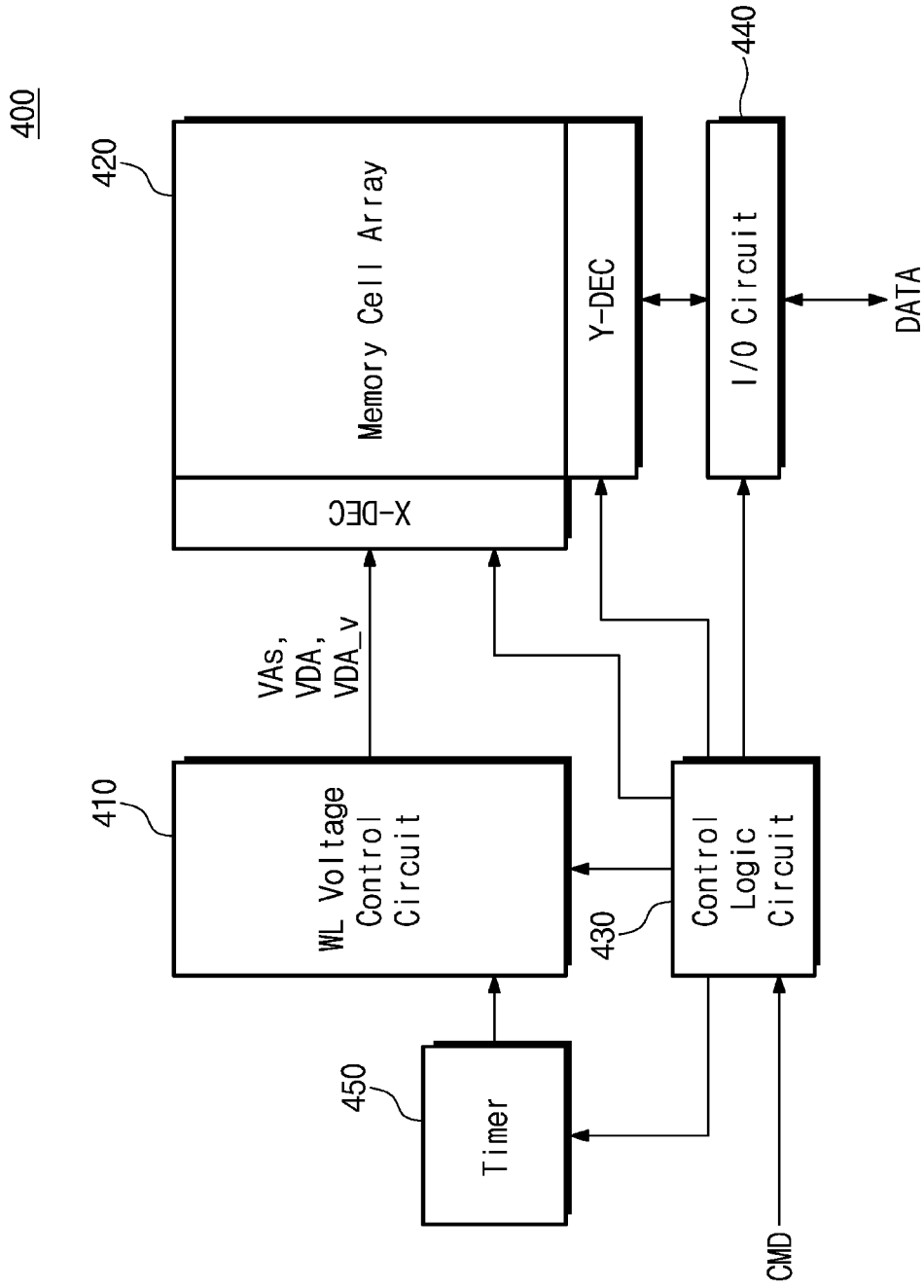
FIG. 13 is a block diagram illustrating a memory device according to an embodiment of the inventive concept.

FIG. 13 is a block diagram illustrating a memory device according to an embodiment of the inventive concept. Referring to FIG. 13, a memory device 400 may include a wordline voltage control circuit 410, a memory cell array 420, a control logic circuit 430, an input/output circuit 440, and a timer 450. The wordline voltage control circuit 410, the memory cell array 420, the control logic circuit 430, and the input/output circuit 440 are described above, and thus, additional description will be omitted to avoid redundancy.

The timer 450 may be configured to detect an elapsed time which elapses from a time point when the active command ACT is received from the memory controller 11 (refer to FIG. 1). The wordline voltage control circuit 410 may be configured to adjust the variable deactivation voltage VDA_v based on the elapsed time detected from the timer 450. For example, the wordline voltage control circuit 410 may decrease a level of a variable deactivation voltage to be applied to unselected wordlines as time goes on from the time point when the active command ACT is received. The decrease in the variable deactivation voltage may make it possible to prevent deterioration of memory cells connected to the unselected wordlines occurring as a high voltage (e.g., the first activation voltage VA1) is applied to the selected wordline during the wordline activation period tRAS and a time passes.

For example, as the wordline voltage control circuit 410 decreases a voltage (e.g., a variable deactivation voltage) to be applied to unselected wordlines depending on a time elapsing from the time point when the active command ACT is received, thus reducing deterioration of memory cells connected to the unselected wordlines due to a high voltage applied to the selected wordline.

Figure 14:
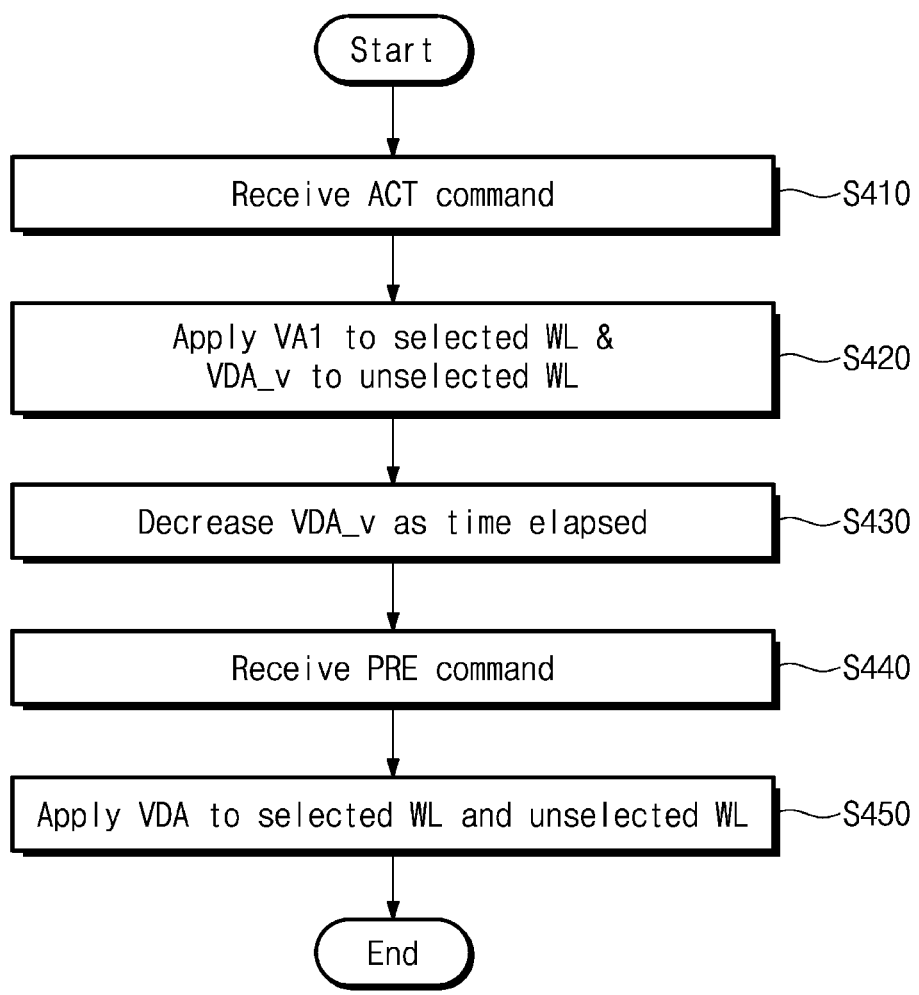
FIG. 14 is a flowchart illustrating an operation of a memory device of FIG. 13 according to example embodiments.
Figure 15:
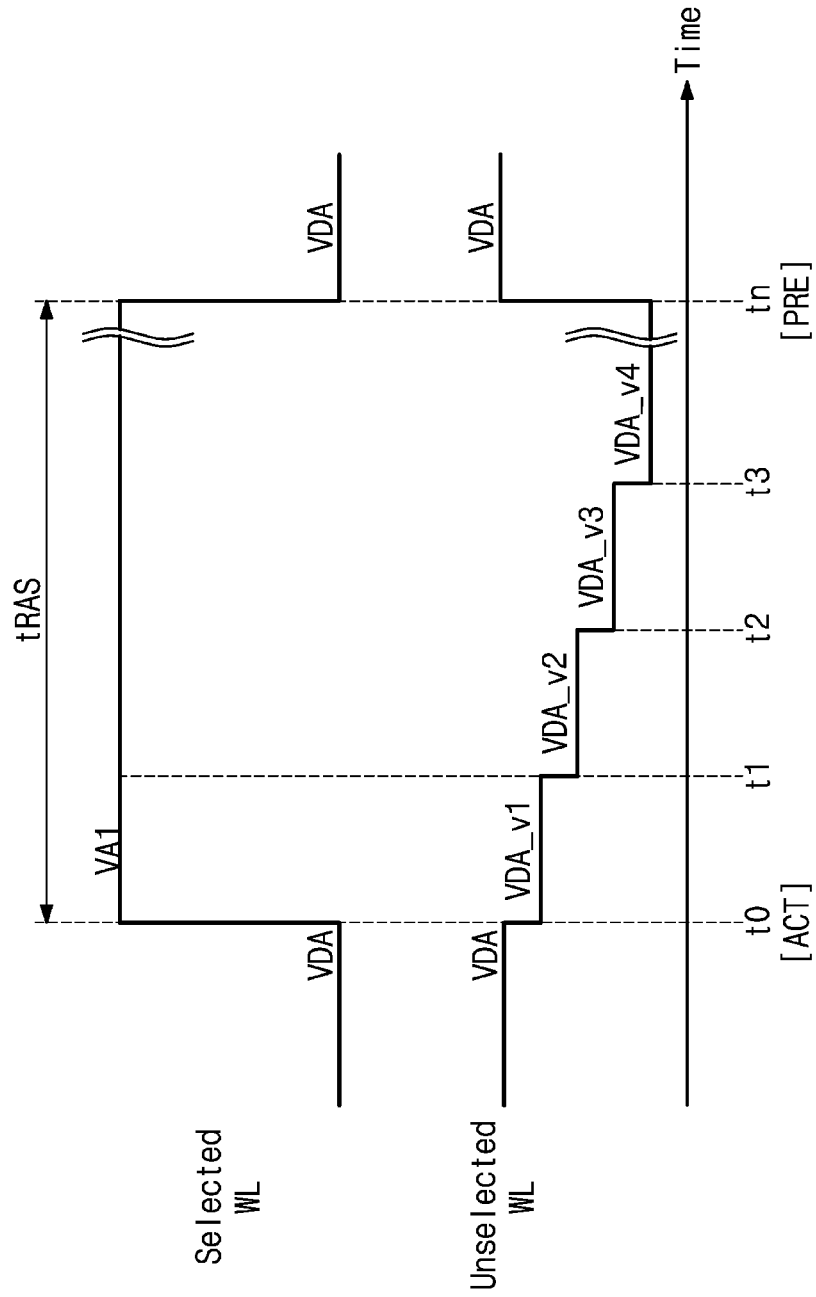
FIG. 15 is a graph for describing an operation of a memory device according to a flowchart of FIG. 14, according to example embodiments.

FIG. 14 is a flowchart illustrating an operation of a memory device of FIG. 13 according to example embodiments. FIG. 15 is a graph for describing an operation of a memory device according to a flowchart of FIG. 14, according to example embodiments.

Referring to FIGS. 13 to 15, in operation S410, the memory device 400 may receive the active command ACT.

In operation S420, the memory device 400 may apply the first activation voltage VA1 to a selected wordline and may apply the variable deactivation voltage VDA_v to unselected wordlines. In operation S430, the memory device 400 may decrease a level of the variable deactivation voltage VDA_v as a time elapses. In operation S440, the memory device 400 may receive the precharge command PRE. In operation S450, the memory device 400 may apply the deactivation voltage VDA to the selected wordline and the unselected wordlines.

For example, as illustrated in FIG. 15, at a 0-th time point t0 when the active command ACT is received, the memory device 400 may apply a first activation voltage VA1 to the selected wordline and may apply a first variable deactivation voltage VDA_v1 to the unselected wordlines. After a given time elapses, for example, at the first time point t1, the memory device 400 may decrease a voltage of the unselected wordlines from the first variable deactivation voltage VDA_v1 to a second variable deactivation voltage VDA_v2. After a given time elapses, for example, at a second time point t2 and a third time point t3, the memory device 400 may decrease a voltage of the unselected wordlines to a third variable deactivation voltage VDA_v3 and a fourth variable deactivation voltage VDA v4, respectively. At an n-th time point tn, the memory device 400 may receive the precharge command PRE and may apply the deactivation voltage VDA to the selected wordline and the unselected wordlines in response to the received precharge command PRE.

In an example embodiment, the first variable deactivation voltage VDA_v1 which is applied to the unselected wordlines in response to the active command ACT may be lower than or equal to the deactivation voltage VDA. In an example embodiment, a level of the first variable deactivation voltage VDA_v1 which is applied to the unselected wordlines in response to the active command ACT may be determined according to the number of active commands ACT associated with the selected wordline. For example, as the number of active commands ACT associated with the selected wordline increases, a level of the first variable deactivation voltage VDA_v1 may decrease.

In an example embodiment, a decrement of the first variable deactivation voltage VDA_v1 may be determined in advance or may be set during an operation of the memory device 400. For example, as the number of active commands ACT associated with the selected wordline increases, the memory device 400 may increase a decrement of a variable deactivation voltage.

Figure 16:
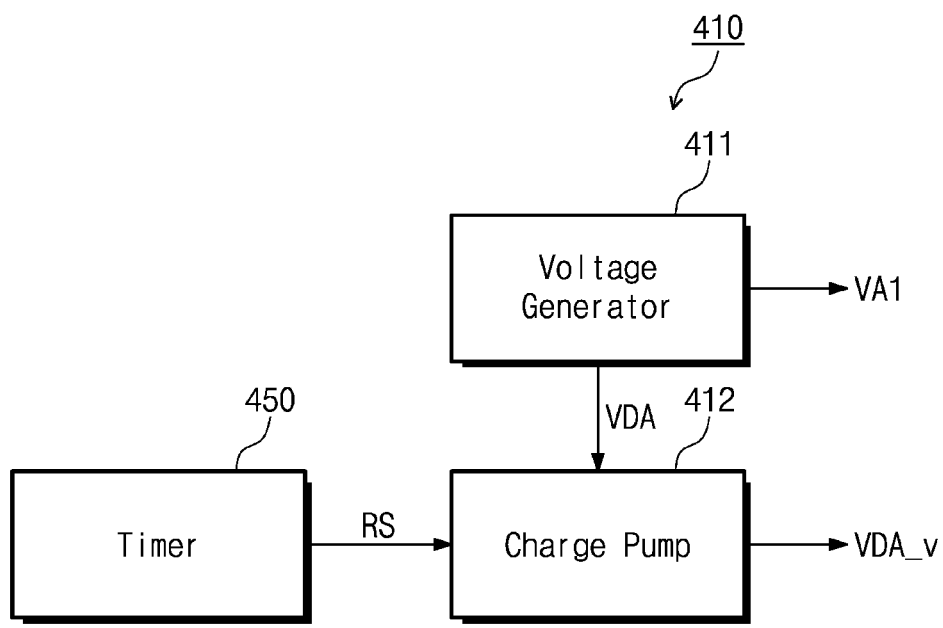
FIG. 16 is a block diagram illustrating a wordline voltage control circuit of FIG. 13 according to example embodiments.

FIG. 16 is a block diagram illustrating a wordline voltage control circuit of FIG. 13 according to example embodiments. Referring to FIGS. 13, 15, and 16, the wordline voltage control circuit 410 may include a voltage generator 411 and a charge pump 412.

The voltage generator 411 may be configured to generate the first activation voltage VA1 and the deactivation voltage VDA.

The charge pump 412 may be configured to generate and output the variable deactivation voltage VDA_v based on the deactivation voltage VDA. For example, the timer 450 may be configured to periodically output a reference signal RS based on a detected time which elapsed from a time point when the active command ACT is received. The charge pump 412 may be configured to pump the deactivation voltage VDA in a negative direction in response to the reference signal RS from the timer 450.

In some examples, the voltage generator 411 may generate the first activation voltage VA1 in response to the reference signal RS from the timer 450.

In detail, as illustrated in FIG. 15, the timer 450 may output the reference signal RS at the first time point t1 when a given time elapses from the 0-th time point t0 when the active command ACT is received. The charge pump 412 may perform a charge pumping operation once or more in response to the reference signal RS to decrease the variable deactivation voltage VDA_v from the first variable deactivation voltage VDA_v1 to the second variable deactivation voltage VDA_v2. Likewise, the timer 450 may output the reference signal RS at the second time point t2, and the charge pump 412 may decrease the variable deactivation voltage VDA_v from the second variable deactivation voltage VDA_v2 to the third variable deactivation voltage VDA_v3 in response to the reference signal RS.

Although not illustrated in FIG. 16, the wordline voltage control circuit 410 may further include additional charge pumps. The additional charge pumps may be used to generate the activation voltages VAs or to adjust a level of the activation voltages VAs. In some examples, the voltage generator 411 may include an additional charge pump configured to generate the first activation voltage VA1 based on the second activation voltage VA2 or the power supply voltage VCC.

In an example embodiment, the wordline voltage control circuit 410 may adjust a variable deactivation voltage by performing a charge pumping operation based on a counting value of the active command counter 350 described with reference to FIG. 10.

Figure 17A:
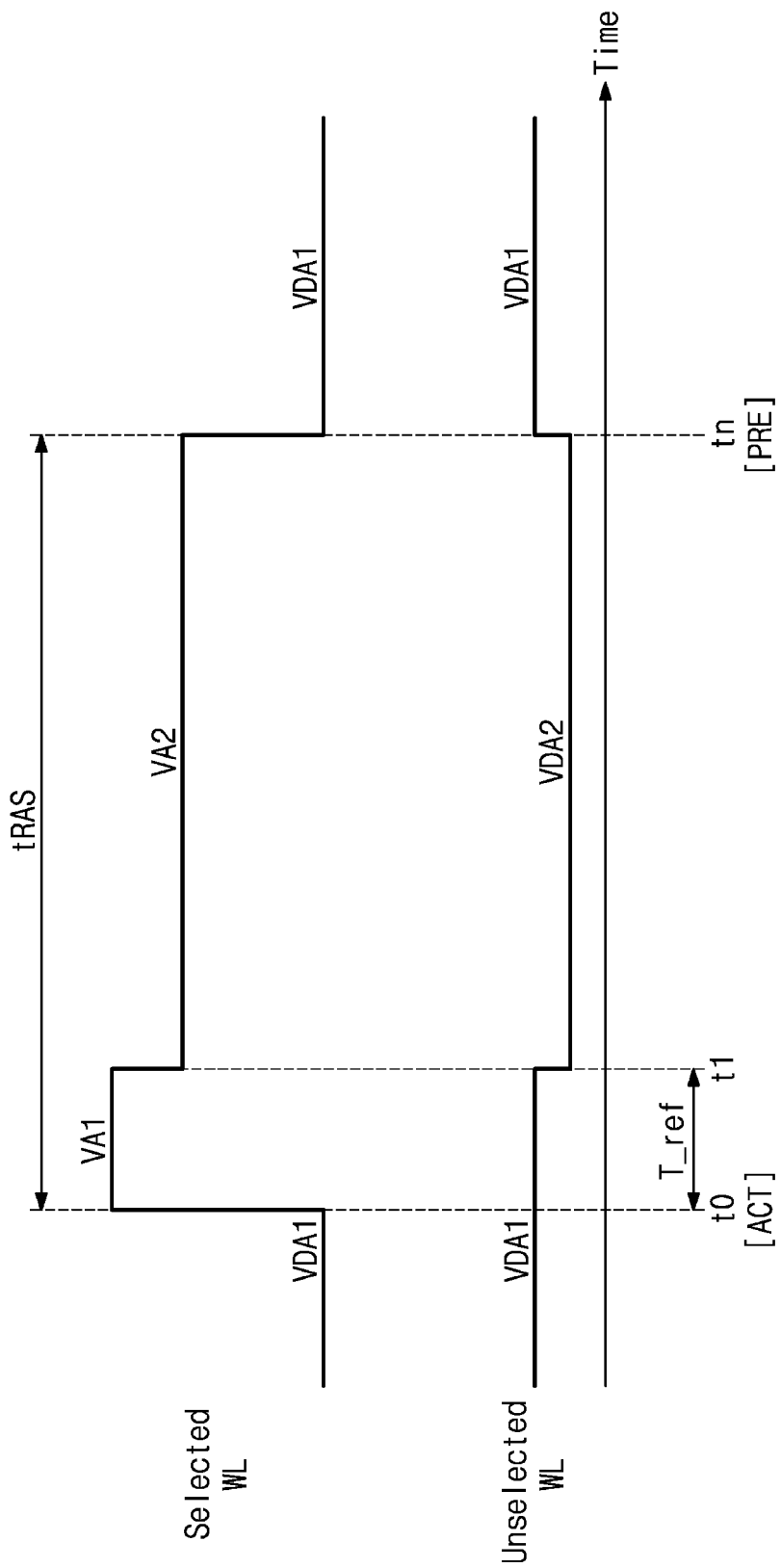
FIGS. 17A and 17B are graphs for describing an operation of a memory device of FIG. 2 according to example embodiments.
Figure 17B:
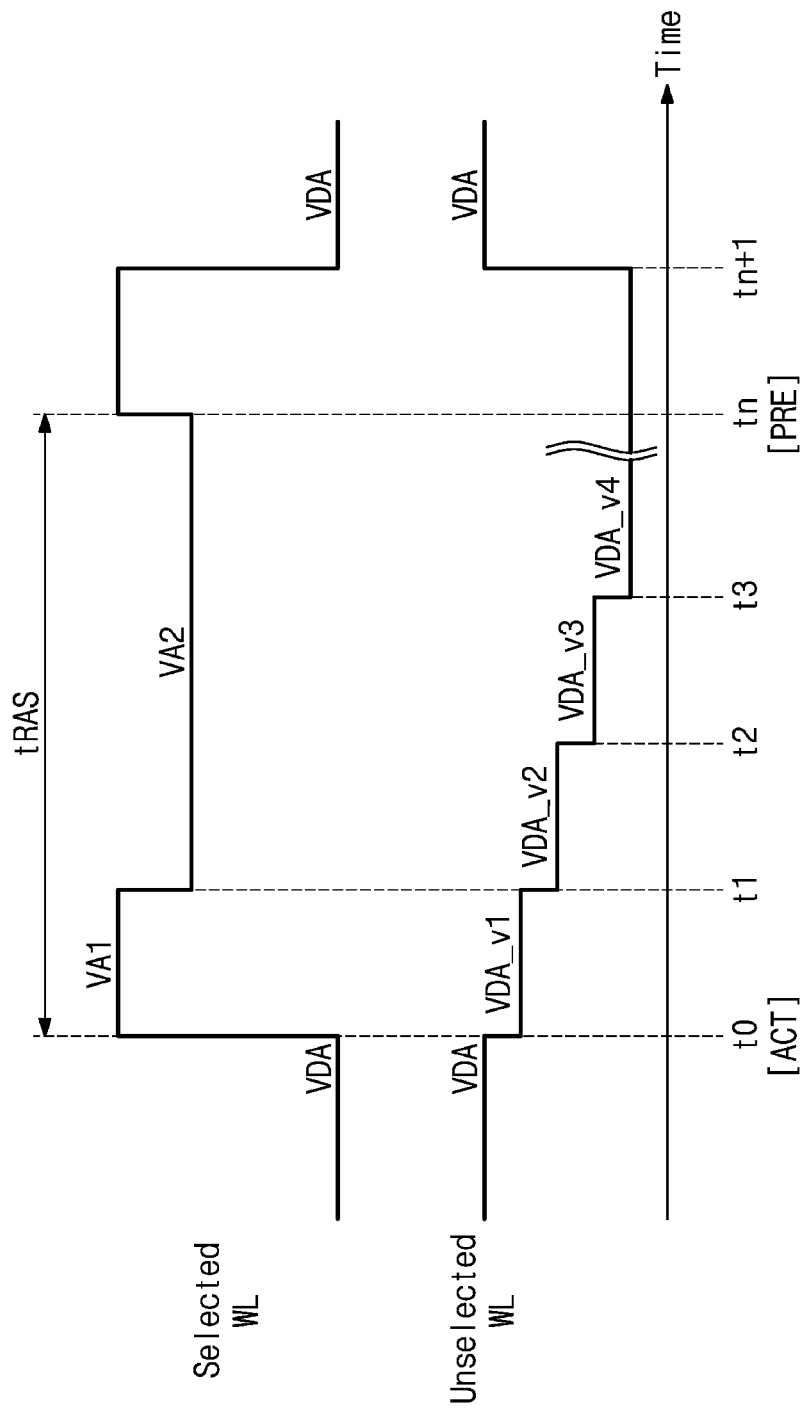

FIGS. 17A and 17B are graphs for describing an operation of a memory device of FIG. 2 according to example embodiments. Below, for convenience of description, the embodiment of the inventive concept according to graphs of FIGS. 17A and 17B is described with reference to the memory device 100 of FIG. 2, but the inventive concept is not limited thereto.

The embodiment in which a voltage (i.e., an activation voltage) of a selected wordline is adjusted during the wordline activation period tRAS is with reference to FIGS. 4, 5 and 6A to 6C, and the embodiment in which a voltage (i.e., a deactivation voltage) of unselected wordlines is adjusted is with reference to FIGS. 7 to 11, 12A, 12B and 13 to 16. However, the inventive concept is not limited thereto.

For example, referring to FIGS. 2 and 17A, in response to the active command ACT, the memory device 100 may apply the first activation voltage VA1 to the selected wordline and may apply the first deactivation voltage VDA1 to the unselected wordlines. After the reference time interval T_ref elapses from a 0-th time point t0 when the active command ACT is received (i.e., at a first time point t1), the memory device 100 may decrease a voltage of the selected wordline from the first activation voltage VA1 to the second activation voltage VA2, and may decrease a voltage of the unselected wordlines from the first deactivation voltage VDA1 to the second deactivation voltage VDA2. In some examples, at the 0-th time point t0, the memory device 100 may decrease a voltage of the unselected wordlines from the first deactivation voltage VDA1 to the second deactivation voltage VDA2. The memory device 100 may apply the first deactivation voltage VDA1 to the selected wordline and the unselected wordlines in response to the precharge command PRE at the n-th time point tn.

Alternatively, referring to FIGS. 2 and 17B, in response to the active command ACT, the memory device 100 may apply the first activation voltage VA1 to the selected wordline and may apply the first variable deactivation voltage VDA_v1 to the unselected wordlines. After a given time elapses from the 0-th time point t0 when the active command ACT is received (i.e., at a first time point t1), the memory device 100 may decrease a voltage of the selected wordline from the first activation voltage VA1 to the second activation voltage VA2, and may decrease a voltage of the unselected wordlines from the first variable deactivation voltage VDA_v1 to the second variable deactivation voltage VDA_v2. After, as a time elapses, the memory device 100 may decrease a voltage of the unselected wordlines to the third variable deactivation voltage VDA_v3 at a second time point t2 and to the fourth variable deactivation voltage VDA v4 at a third time point t3. The memory device 100 may re-apply the first activation voltage VA1 in response to the precharge command PRE at an n-th time point tn, and apply a deactivation voltage VDA to the selected wordline and the unselected wordlines in response to the precharge command PRE at an (n+1)-th time point tn+1.

In an example embodiment, various parameters such as a magnitude of the second activation voltage VA2, a magnitude of the first variable deactivation voltage VDA_v1, a decrement of a variable deactivation voltage, and a reference time may be set in advance or may be updated while the memory device 100 operates. In an example embodiment, the parameters may be determined according to a number of active commands ACT input to the memory device 100 with regard to a particular wordline during a predetermined period.

The embodiments of the inventive concept according to the graphs of FIGS. 17A and 17B are exemplary, and the inventive concept is not limited thereto. For example, a memory device according to the inventive concept may operate based on a manner in which the embodiments described above are variously changed or combined without departing from the technical idea of the inventive concept. For example, a memory device according to embodiments of the inventive concept may adjust a voltage of a selected wordline and a voltage of unselected wordlines in various manners during the wordline activation period tRAS.

Figure 18:
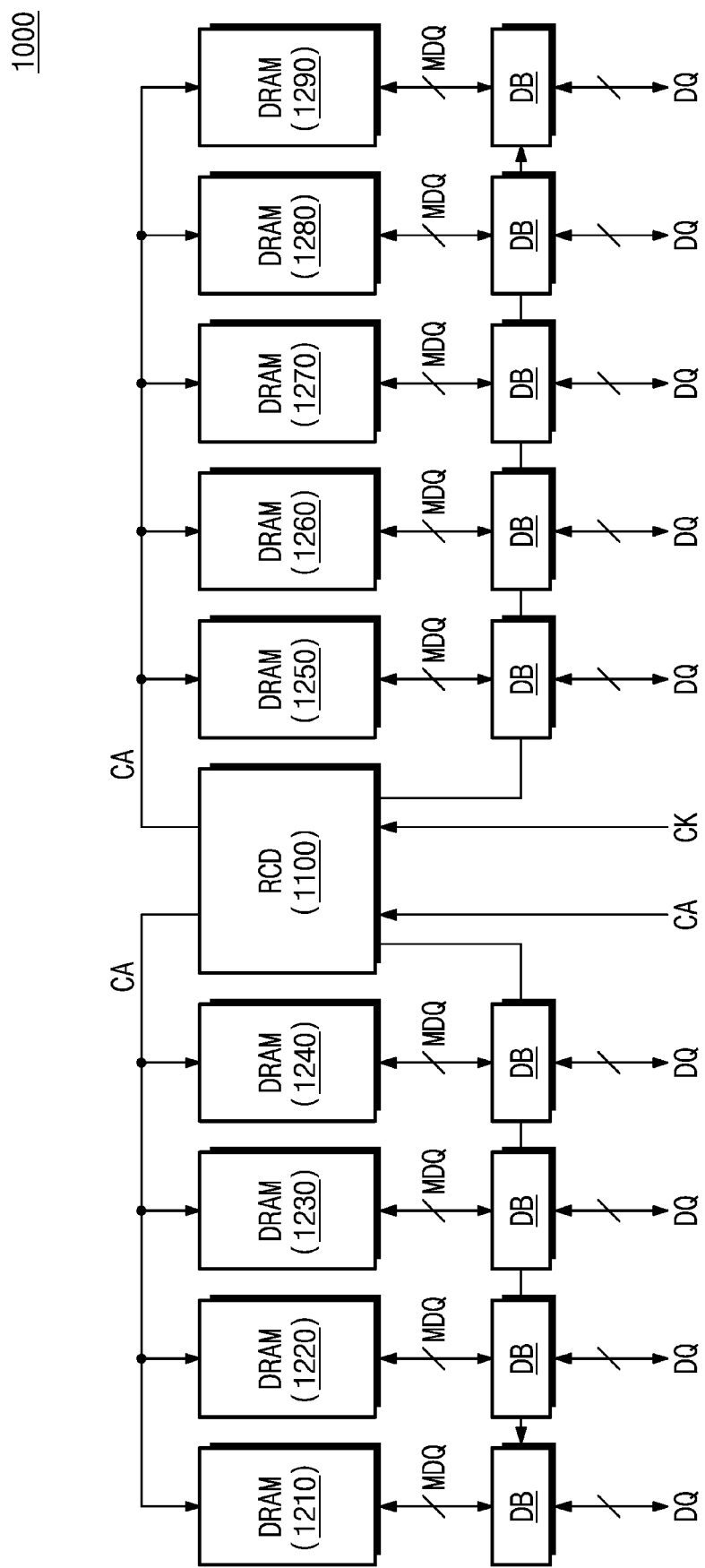
FIG. 18 is a block diagram illustrating a memory module according to example embodiments of the inventive concept.

FIG. 18 is a block diagram illustrating a memory module according to example embodiments of the inventive concept. Referring to FIG. 18, a memory module 1000 may include a register clock driver (RCD) 1100, a plurality of DRAM devices 1210 to 1290, and a plurality of data buffers DB. The RCD 1100 may receive a command/address CA and a clock signal CK from an external device (e.g., a host or a memory controller). In response to the received signals, the RCD 1100 may transmit the command/address CA to the plurality of DRAM devices 1210 to 1290 and may control the plurality of data buffers DB.

The plurality of DRAM devices 1210 to 1290 may be respectively connected with the plurality of data buffers DB through memory data lines MDQ. In example embodiments, each of the plurality of DRAM devices 1210 to 1290 may be a memory device described with reference to FIGS. 1 to 5, 6A, 6B, 7 to 11, 12A, 12B, 13 to 16, 17A, and 17B or may operate according to an operation method described with reference to FIGS. 1 to 5, 6A, 6B, 7 to 11, 12A, 12B, 13 to 16, 17A, and 17B. The plurality of data buffers DB may transmit and receive data to and from an external device (e.g., a host or a memory controller) through a plurality of data lines DQ.

In an example embodiment, the memory module 1000 illustrated in FIG. 18 may have the form factor of a load reduced dual in-line memory module (LRDIMM). However, the inventive concept is not limited thereto. For example, the memory module 1000 may have the form factor of a registered DIMM (RDIMM) in which the plurality of data buffers DB are not included.

Figure 19:
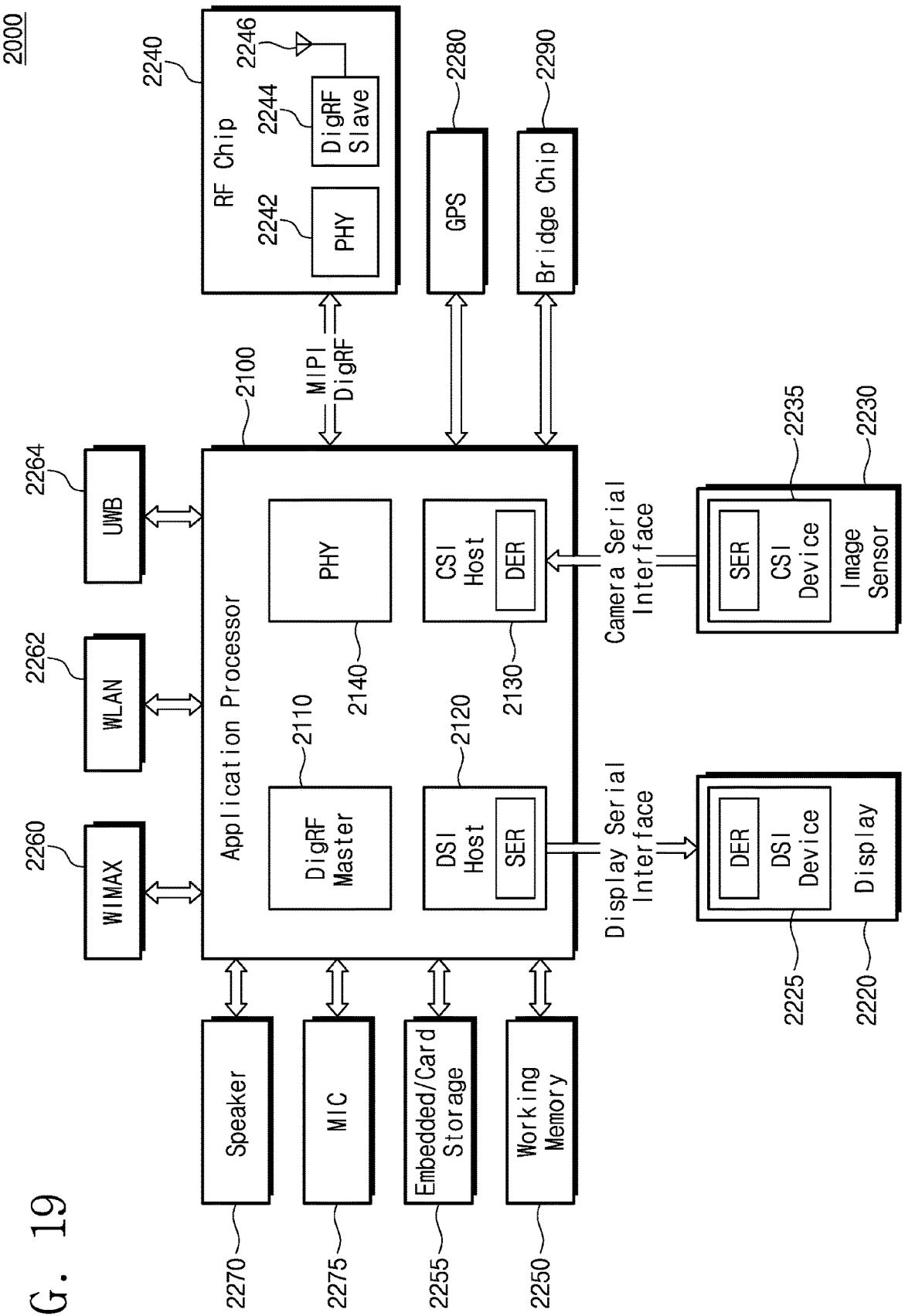
FIG. 19 is a block diagram illustrating an electronic system according to an embodiment of the inventive concept.

FIG. 19 is a block diagram illustrating an electronic system according to an embodiment of the inventive concept. Referring to FIG. 19, an electronic system 2000 may be implemented in the form of a portable communication terminal, a personal digital assistant (PDA), a portable multimedia player (PMP), a smartphone, or a wearable device, or in the form of a computing system such as a personal computer, a server, a workstation, or a notebook computer.

The electronic system 2000 may include an application processor 2100 (or a central processing unit), a display 2220, and an image sensor 2230. The application processor 2100 may include a DigRF master 2110, a display serial interface (DSI) host 2120, a camera serial interface (CSI) host 2130, and a physical layer 2140.

The DSI host 2120 may communicate with a DSI device 2225 of the display 2220 through the DSI. In an example embodiment, an optical serializer SER may be implemented in the DSI host 2120. An optical deserializer DES may be implemented in the DSI device 2225. The CSI host 2130 may communicate with a CSI device 2235 of the image sensor 2230 through the CSI. In an example embodiment, an optical deserializer DES may be implemented in the CSI host 2130. For example, an optical serializer SER may be implemented in the CSI device 2235.

The electronic system 2000 may communicate with the application processor 2100 and may further include a radio frequency (RF) chip 2240 including a physical layer 2242, a DigRF slave 2244, and an antenna 2246. In an example embodiment, the physical layer 2242 of the RF chip 2240 and the physical layer 2140 of the application processor 2100 may exchange data with each other through an MIPI DigRF interface.

The electronic system 2000 may further include a working memory 2250 and embedded/card storage 2255. The working memory 2250 and the embedded/card storage 2255 may store data provided from the application processor 2100. The working memory 2250 and the embedded/card storage 2255 may provide the data stored therein to the application processor 2100. The working memory 2250 may temporarily store data processed or to be processed by the application processor 2100. In example embodiments, the working memory 2250 may be a memory device described with reference to FIGS. 1 to 5, 6A, 6B, 7 to 11, 12A, 12B, 13 to 16, 17A, and 17B. Alternatively, the working memory 2250 may operate based on an operation method described with reference to FIGS. 1 to 5, 6A, 6B, 7 to 11, 12A, 12B, 13 to 16, 17A, and 17B.

The electronic system 2000 may communicate with an external system through a worldwide interoperability for microwave access (WiMAX) 2260, a wireless local area network (WLAN) 2262, and an ultra-wideband (UWB) 2264.

The electronic system 2000 may further include a speaker 2270 and a microphone 2275 for the purpose of processing voice information. In an example embodiment, the electronic system 2000 may further include a global positioning system (GPS) device 2280 for processing position information. The electronic system 2000 may further include a bridge chip 2290 for managing connections between peripheral devices.

According to the above disclosed embodiments of the inventive concept, a memory device may control various voltages (e.g., an activation voltage or a deactivation voltage) to be provided to a selected wordline or unselected wordlines during the wordline activation period tRAS. As such, since a time interval when an activation voltage being a high voltage is applied decreases or a voltage to be applied to unselected wordlines decreases, deterioration occurring at memory cells may be reduced. Accordingly, a memory device with improved reliability and improved performance is provided.

According to the above disclosed embodiments of the inventive concept, a memory device may adjust a level of an activation voltage or a deactivation voltage to be provided to a selected wordline or unselected wordlines during the wordline activation period tRAS. As such, deterioration of memory cells due to the activation voltage being a high voltage may be reduced. Accordingly, a memory device with improved reliability and improved performance and an operation method thereof are provided.

While the inventive concept has been described with reference to example embodiments thereof, it will be apparent to those of ordinary skill in the art that various changes and modifications may be made thereto without departing from the spirit and scope of the inventive concept as set forth in the following claims.

What is claimed is:

1. An operation method of a memory device, the method comprising:
receiving an active command from an external device;
during a first time interval, applying a first activation voltage to a selected wordline in response to the active command;
applying a second activation voltage to the selected wordline after the first time interval elapses from a first time point when the active command is received;
receiving a precharge command from the external device; and
applying a first deactivation voltage to the selected wordline in response to the precharge command,
wherein the second activation voltage is lower than the first activation voltage and is higher than the first deactivation voltage.

2. The method of claim 1, further comprising:
re-applying the first activation voltage to the selected wordline after the second time interval elapses from a second time point when the second activation voltage is applied to the selected wordline.

3. The method of claim 1, wherein, during a second time interval, the first activation voltage is re-applied to the selected wordline in response to the precharge command, and the first deactivation voltage is applied after the second time interval.

4. The method of claim 1, further comprising:
during the first time interval, applying a second deactivation voltage to unselected wordlines in response to the active command; and
applying a third deactivation voltage lower than the second deactivation voltage to the unselected wordlines after the first time interval,
wherein the second deactivation voltage is equal to or lower than the first deactivation voltage.

5. The method of claim 4, further comprising:
applying a fourth deactivation voltage lower than the third deactivation voltage to the unselected wordlines after a second time interval elapses from a second time point when the third deactivation voltage is applied.

6. The method of claim 5, further comprising:
during a predetermined period, counting a number of active commands accumulated with respect to the selected wordline,
wherein a level of each of the second to fourth deactivation voltages is adjusted based on a result of the counting.

7. The method of claim 6, wherein the third deactivation voltage decreases as the number of the accumulated active commands increases.

8. The method of claim 4, further comprising:
applying the first deactivation voltage to the unselected wordlines in response to the precharge command.

9. The method of claim 1, wherein a difference of the first activation voltage and the second activation voltage is smaller than a difference of the second activation voltage and the first deactivation voltage.

10. The method of claim 1, further comprising:
receiving at least one operation command and performing an operation corresponding to the received at least one operation command, between the first time point and a second time point when the precharge command is received.

11. The method of claim 1, wherein the selected wordline is connected to a plurality of dynamic random access memory (DRAM) cells.

12. A memory device comprising:
a memory cell array including a plurality of memory cells connected to a plurality of wordlines;
a control logic circuit configured to receive an active command from an external device; and
a wordline voltage control circuit configured to:
apply a first activation voltage to a selected wordline of the plurality of wordlines in response to the active command, and
apply a second activation voltage lower than the first activation voltage to the selected wordline after a first time interval elapses from a time point when the active command is received.

13. The memory device of claim 12, wherein the control logic circuit is further configured to receive a precharge command from the external device after receiving the active command,
wherein the wordline voltage control circuit is further configured to apply a deactivation voltage to the selected wordline in response to the precharge command, and
wherein the deactivation voltage is lower than the first activation voltage and the second activation voltage.

14. The memory device of claim 12, wherein the wordline voltage control circuit is further configured to apply a first deactivation voltage to unselected wordlines of the plurality of wordlines in response to the active command.

15. The memory device of claim 14, further comprising:
an active command counter configured to count a number of active commands accumulated with respect to the selected wordline during a predetermined period,
wherein the wordline voltage control circuit decreases the first deactivation voltage as the number of the accumulated active commands increases.

16. The memory device of claim 14, further comprising:
a timer configured to periodically output a reference signal based on a time elapsing from the time point when the active command is received,
wherein the wordline voltage control circuit includes a charge pump configured to decrease the first deactivation voltage as much as a given level in response to the reference signal.

17. An operation method of a memory device, the method comprising:
receiving an active command from an external device;
during a first time interval, applying a first activation voltage to a selected wordline and a first deactivation voltage to unselected wordlines in response to the active command;
applying a second activation voltage lower than the first activation voltage to the selected wordline and a second deactivation voltage lower than the first deactivation voltage to at least a first wordline of the unselected wordlines after the first time interval elapses from a first time point when the active command is received;
receiving a precharge command from the external device; and
applying the first deactivation voltage to the selected wordline and the unselected wordlines in response to the precharge command.

18. The method of claim 17, wherein the at least one wordline of the unselected wordlines is one or more wordlines physically adjacent to the selected wordline.

19. The method of claim 17, further comprising:
applying a third deactivation voltage lower than the second deactivation voltage to the at least one wordline of the unselected wordlines after a second time interval elapses from a second time point when the second deactivation voltage is applied to the at least one word line of the unselected wordlines.

20. The method of claim 17, wherein a level of the second deactivation voltage is adjusted according to, in a predetermined period, a number of active commands accumulated with respect to the selected wordline.

* * * * *